(12) United States Patent
Wakiyama et al.

(10) Patent No.: US 11,063,020 B2
(45) Date of Patent: Jul. 13, 2021

(54) SEMICONDUCTOR DEVICE, MANUFACTURING METHOD FOR SEMICONDUCTOR DEVICE, AND ELECTRONIC DEVICE

(71) Applicant: Sony Corporation, Tokyo (JP)

(72) Inventors: Satoru Wakiyama, Kanagawa (JP); Masaki Okamoto, Kumamoto (JP); Yutaka Ooka, Kanagawa (JP); Reijiroh Shohji, Tokyo (JP); Yoshifumi Zaizen, Kanagawa (JP); Kazunori Nagahata, Kanagawa (JP); Masaki Haneda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/521,215

(22) Filed: Jul. 24, 2019

(65) Prior Publication Data
US 2019/0348398 A1    Nov. 14, 2019

Related U.S. Application Data

(60) Continuation of application No. 15/887,242, filed on Feb. 2, 2018, now Pat. No. 10,373,934, which is a
(Continued)

(30) Foreign Application Priority Data

Jun. 29, 2012  (JP) ................................. 2012-147316
Feb. 12, 2013  (JP) ................................. 2013-024505

(51) Int. Cl.
*H01L 25/065* (2006.01)
*H01L 21/768* (2006.01)
(Continued)

(52) U.S. Cl.
CPC .... *H01L 25/0657* (2013.01); *H01L 21/30604* (2013.01); *H01L 21/31111* (2013.01);
(Continued)

(58) Field of Classification Search
CPC ................................................ H01L 21/76805
See application file for complete search history.

(56) References Cited

U.S. PATENT DOCUMENTS

2009/0189256 A1*   7/2009  Yoshimura ............ H01L 23/481
                                                              257/621
2010/0109164 A1    5/2010  Kang et al.
(Continued)

FOREIGN PATENT DOCUMENTS

CN         1534772      10/2004
CN       101017800       8/2007
(Continued)

OTHER PUBLICATIONS

Official Action (with English translation) for Chinese Patent Application No. 201711458686.9, dated Sep. 29, 2020, 14 pages.
(Continued)

*Primary Examiner* — Thao P Le
(74) *Attorney, Agent, or Firm* — Sheridan Ross P.C.

(57) ABSTRACT

There is provided a semiconductor device a method for manufacturing a semiconductor device, and an electronic apparatus that comprises a semiconductor device, the semiconductor device including a first chip, a second chip that is bonded onto a first surface side of the first chip, a through electrode that is formed to penetrate from a second surface side of the first chip to a wiring layer on the second semiconductor base substrate, and an insulation layer that is disposed between the through electrode and a semiconductor base substrate in the first chip.

20 Claims, 23 Drawing Sheets

Related U.S. Application Data continuation of application No. 15/354,871, filed on Nov. 17, 2016, now Pat. No. 9,922,961, which is a continuation of application No. 15/097,093, filed on Apr. 12, 2016, now Pat. No. 9,524,925, which is a division of application No. 14/409,634, filed as application No. PCT/JP2013/066876 on Jun. 19, 2013, now Pat. No. 9,343,392.

(51) Int. Cl.
| | |
|---|---|
| *H01L 27/146* | (2006.01) |
| *H01L 23/48* | (2006.01) |
| *H01L 21/306* | (2006.01) |
| *H01L 25/00* | (2006.01) |
| *H01L 21/311* | (2006.01) |
| *H01L 23/00* | (2006.01) |

(52) U.S. Cl.
CPC .. *H01L 21/31116* (2013.01); *H01L 21/76805* (2013.01); *H01L 21/76877* (2013.01); *H01L 21/76898* (2013.01); *H01L 23/481* (2013.01); *H01L 24/32* (2013.01); *H01L 24/83* (2013.01); *H01L 25/50* (2013.01); *H01L 27/1469* (2013.01); *H01L 27/14632* (2013.01); *H01L 27/14634* (2013.01); *H01L 27/14636* (2013.01); *H01L 27/14687* (2013.01); *H01L 2224/32145* (2013.01); *H01L 2225/06541* (2013.01); *H01L 2225/06544* (2013.01); *H01L 2225/06548* (2013.01); *H01L 2924/0002* (2013.01)

(56) References Cited

U.S. PATENT DOCUMENTS

| | | | |
|---|---|---|---|
| 2010/0258944 A1* | 10/2010 | Uchiyama | H01L 24/82 257/773 |
| 2011/0266692 A1 | 11/2011 | Sasaki et al. | |
| 2013/0320493 A1* | 12/2013 | Chang | H01L 23/49822 257/532 |
| 2019/0157300 A1* | 5/2019 | Andrieu | H01L 27/1288 |

FOREIGN PATENT DOCUMENTS

| | | |
|---|---|---|
| CN | 102024782 | 4/2011 |
| CN | 102054849 | 5/2011 |
| CN | 102446933 | 5/2012 |
| CN | 103219344 | 7/2013 |
| JP | 2000-091423 | 3/2000 |
| JP | 2003-142576 | 5/2003 |

OTHER PUBLICATIONS

Official Action (with English translation) for Chinese Patent Application No. 201711458678.4, dated Apr. 2, 2021, 19 pages.
Official Action (with English translation) for Chinese Patent Application No. 201711457463.0, dated Apr. 2, 2021, 20 pages.

* cited by examiner

SEMICONDUCTOR DEVICE, MANUFACTURING METHOD FOR SEMICONDUCTOR DEVICE, AND ELECTRONIC DEVICE

CROSS REFERENCE TO RELATED APPLICATIONS

This application is a continuation of U.S. patent application Ser. No. 15/887,242, filed Feb. 2, 2018, now U.S. Pat. No. 10,373,934, which is a continuation of U.S. patent application Ser. No. 15/354,871, filed Nov. 17, 2016, now U.S. Pat. No. 9,922,961, which is a continuation of U.S. patent application Ser. No. 15/097,093, filed Apr. 12, 2016, now U.S. Pat. No. 9,524,925, which is a divisional application and claims the benefit of U.S. patent application Ser. No. 14/409,634 filed Dec. 19, 2014, now U.S. Pat. No. 9,343,392, which claims the benefit of PCT Application No. PCT/JP2013/066876 having an international filing date of Jun. 19, 2013, which designated the United States, which PCT application claimed the benefit of Japanese Patent Application No. 2012-147316 filed Jun. 29, 2012, and Japanese Patent Application No. 2013-024505 filed Feb. 12, 2013, the disclosures of all of which are incorporated herein by reference in their entirety.

TECHNICAL FIELD

The present technology relates to a semiconductor device including a through electrode of a semiconductor base substrate, a manufacturing method for the semiconductor device, and an electronic device including the semiconductor device.

BACKGROUND ART

Hitherto, semiconductor devices having a configuration in which different kinds of devices are bonded and a through electrode penetrates a base substrate of an upper chip and is connected to an electrode of a lower base substrate have been suggested (for example, see Patent Literature 1). In such a configuration, after an upper chip side base substrate and a lower chip side base substrate are bonded, a first through electrode penetrating the upper chip side base substrate and connected to an upper chip side electrode pad is formed. Likewise, a second through electrode penetrating the upper chip side base substrate and connected to a lower chip side electrode pad is formed. Then, wirings are connected between the different kinds of chips through a damascene process of connecting the first through electrode to the second through electrode.

As a method of electrically isolating (insulating) a semiconductor base substrate from a through electrode, technologies for forming an insulation film in advance in a semiconductor base substrate and forming a through electrode in the semiconductor base substrate within a region surrounded by the insulation film have been suggested (for example, see Patent Literatures 1 and 2).

CITATION LIST

Patent Literature

Patent Literature 1: JP 2010-245506A
Patent Literature 1: JP 2008-251964A
Patent Literature 1: JP 2011-171567A

SUMMARY OF INVENTION

Technical Problem

In the above-described semiconductor devices in which connection is achieved by the through electrodes, there is a demand for improvement in reliability of a semiconductor device and an electronic device by improving reliability such as a connection property, an insulation property, and a barrier property of the through electrodes.

It is desirable in the present technology to provide a semiconductor device and an electronic device in which reliability is high.

Solution to Problem

A semiconductor device of the present technology includes a first semiconductor base substrate, and a second semiconductor base substrate that is bonded on a first surface side of the first semiconductor base substrate. The semiconductor device further includes a through electrode that is formed by penetrating from a second surface side of the first semiconductor base substrate to a wiring layer on the second semiconductor base substrate, and an insulation layer that surrounds a circumference of the through electrode formed inside the first semiconductor base substrate.

In addition, an electronic device of the present technology includes the semiconductor device and a signal processing circuit that processes an output signal of the semiconductor device.

In addition, a method of manufacturing a semiconductor device of the present technology includes forming an insulation layer that surrounds a circumference of a position at which a through electrode is formed on a first surface of the first semiconductor base substrate, and bonding a second semiconductor base substrate to a first surface side of the first semiconductor base substrate. The method further includes forming an opening portion that penetrates from a second surface side of the first semiconductor base substrate to a wiring layer on the second semiconductor base substrate within a range surrounded by the insulation layer, and forming the through electrode inside the opening portion.

According to the semiconductor device and the method of manufacturing the semiconductor device described above, the insulation layer surrounding the circumference of the through electrode in the first semiconductor base substrate is formed. Therefore, an insulation property between the through electrode and the first semiconductor base substrate can be ensured without formation of the insulation layer on the inner surface of the opening portion in which the through electrode is formed. Further, connection reliability to the wiring layer can be ensured, since the side surface of the through electrode is not covered with an insulation layer. Accordingly, the reliability of the semiconductor device including the through electrode is improved. Further, the reliability of the electronic device including the semiconductor device is improved.

Advantageous Effects of Invention

According to the present technology, it is possible to provide the semiconductor device and the electronic device in which the reliability is high.

DESCRIPTION OF EMBODIMENTS

Figure 1:
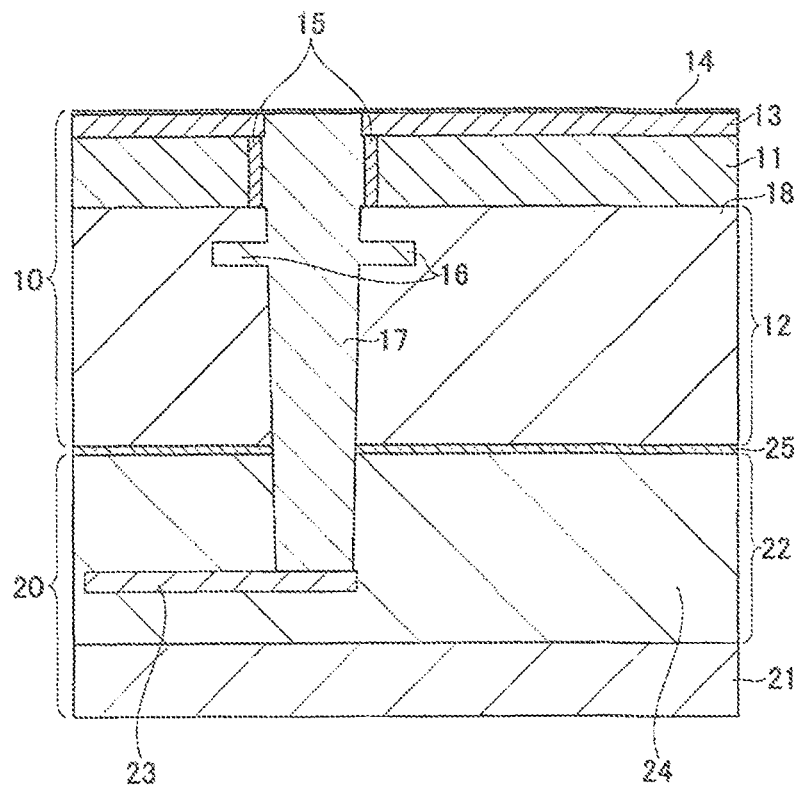
FIG. 1 is a sectional view illustrating a configuration of a semiconductor device according to a first embodiment.

Hereinafter, the preferred embodiments for implementing the present technology will be described, but the present technology is not limited to examples to be described below.

The description will be made in the following order.

1. Semiconductor device according to the first embodiment
2. Method of manufacturing a semiconductor device according to the first embodiment
4. Semiconductor device according to the second embodiment
5. Method of manufacturing a semiconductor device according to the second embodiment
6. Semiconductor device according to the third embodiment
7. Method of manufacturing a semiconductor device according to the third embodiment
8. Semiconductor device according to the fourth embodiment
9. Method of manufacturing a semiconductor device according to the fourth embodiment
10. Electronic device <1. Semiconductor Device According to the First Embodiment>

A semiconductor device including a through electrode according to the first embodiment will be described.

FIG. 1 illustrates the schematic configuration of the semiconductor device including the through electrode according to the present embodiment. FIG. 1 is a sectional view illustrating the semiconductor device near a region in which the through electrode is formed. Note that, in FIG. 1, only the schematic configuration near the region in which the through electrode is formed is illustrated, and each configuration of a semiconductor base substrate or each configuration in the periphery of the through electrode is not illustrated.

As illustrated in FIG. 1, the semiconductor device has a configuration in which a first chip 10 and a second chip 20 are bonded.

The first chip 10 includes a first semiconductor base substrate 11 and a wiring layer 12 formed on one surface (first surface) of the first semiconductor base substrate 11. The second chip 20 includes a second semiconductor base substrate 21 and a wiring layer 22 formed on the second semiconductor base substrate 21. The first chip 10 and the second chip 20 are bonded so that the wiring layers 12 and 22 face each other. A bonding surface 25 is formed on the surfaces of the wiring layers 12 and 22.

The wiring layer 12 of the first semiconductor base substrate 11 includes a multi-layer wiring layer that includes a plurality of conductive layers in which wirings, electrodes and the like are formed, and inter-layer insulation layers that insulate the conductive layers from one another. In FIG. 1, a first electrode pad 16 formed from one conductive layer among the plurality of conductive layers is illustrated in an inter-layer insulation layer 18.

In addition, protective layers 13 and 14 formed from insulation layers are formed on the other surface (second surface) of the first semiconductor base substrate 11. The protective layer 13 is formed to cover the entire second surface of the first semiconductor base substrate 11 other than a position at which a through electrode 17 to be described below is formed. The protective layer 14 is formed to cover an exposed surface of the through electrode 17 and the entire surface of the protective layer 13.

The wiring layer 22 of the second semiconductor base substrate 21 includes a multi-layer wiring layer that includes a plurality of conductive layers in which wirings, electrodes and the like are formed, and inter-layer insulation layers that insulate the conductive layers from one another. In FIG. 1, a second electrode pad 23 formed from one conductive layer among the plurality of conductive layers is illustrated in an inter-layer insulation layer 24. The first electrode pad 16 and the second electrode pad 23 are connected to a wiring or the like (not illustrated) and are connected to various circuit elements in the semiconductor device.

The semiconductor device illustrated in FIG. 1 includes the through electrode 17 that penetrates the wiring layer 12, the bonding surface 25, and the second electrode pad 23 of the wiring layer 22 from the second surface of the first semiconductor base substrate 11. The through electrode 17 is formed inside an opening portion penetrating the protective layer 13, the first semiconductor base substrate 11, and the wiring layers 12 and 22.

In addition, the side surface of the through electrode 17 is connected to an inner surface of the opening portion of the first electrode pad 16. The bottom surface of the through electrode 17 is connected to the surface of the second electrode pad 23. Thus, the through electrode 17 electrically connects the first electrode pad 16 of the wiring layer 12 to the second electrode pad 23.

An insulation layer 15 is formed on the interface of the first semiconductor base substrate 11 coming in contact with the through electrode 17. The through electrode 17 penetrates the protective layer 13 on the second surface of the first semiconductor base substrate 11 and an end surface of the through electrode is exposed to the surface of the protective layer 13. In addition, the protective layer 14 is formed to cover the upper surface of the through electrode 17 and the protective layer 13.

Here, the insulation layer 15 is formed inside the first semiconductor base substrate 11. That is, to form the through electrode 17, the insulation layer is not formed on the inner surface of the opening portion formed in the first semiconductor base substrate 11. By forming the opening portion of the through electrode 17 within the formation range of the insulation layer 15 in advance, it is possible to ensure an insulation property of the through electrode 17 from the first semiconductor base substrate 11 without forming an insulation layer inside the opening portion.

Likewise, to form the through electrode 17, an insulation layer is not formed on the inner surface of the opening portion formed in the wiring layers 12 and 22. Even when an insulation layer is not formed inside the opening portion, the inter-layer insulation layers 18 and 24 forming the wiring layers 12 and 22 can ensure the insulation property of the through electrode 17 from wirings or the like formed in the wiring layers 12 and 22. Further, since an insulation layer is not formed inside the opening portion for the through electrode 17 in the wiring layers 12 and 22, conductive layers such as any wiring of the wiring layers 12 and 22 and electrode pad or the like are configured to be connected to the side surface and the bottom surface of the through electrode 17.

Figure 2:
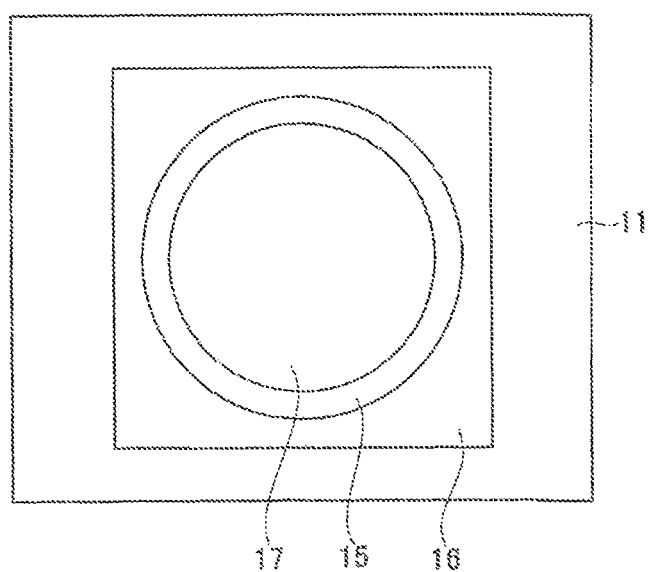
FIG. 2 is a diagram illustrating a planar arrangement of the periphery of a through electrode of the semiconductor device according to the first embodiment.

FIG. 2 is a diagram illustrating the planar arrangement of the through electrode 17, the insulation layer 15, and the first electrode pad 16, when viewed from the second surface side of the first semiconductor base substrate 11.

The insulation layer 15 is formed to surround the circumference of the through electrode 17. As illustrated in FIGS. 1 and 2, the insulation layer 15 surrounds the entire through electrode 17 inside the first semiconductor base substrate 11, and thus electric conduction between the through electrode 17 and the first semiconductor base substrate 11 is blocked.

In addition, as illustrated in FIG. 2, the first electrode pad 16 is formed in a broader area in the wiring layer 12 than the through electrode 17. In addition, as illustrated in FIG. 1, an opening is formed in a middle portion in which the through electrode 17 is formed. Note that, in FIG. 2, the insulation layer 15 is disposed between the through electrode 17 and the first electrode pad 16, however, the first electrode pad 16 extends up to the lower side of the insulation layer 15 to be connected to the through electrode 17.

For example, semiconductor substrates such as silicon substrates and semiconductor substrates applied to a compound semiconductor and other general semiconductor devices can be used as the first semiconductor base substrate 11 and the second semiconductor base substrate 21. In addition, the through electrode 17, the first electrode pad 16, and the second electrode pad 23 are also formed from conductive layers applied to general semiconductor devices. For example, the through electrode 17 and the first electrode pad 16 are formed of copper (Cu), and the second electrode pad 23 is formed of aluminum (Al). The inter-layer insulation layers 18 and 24 and the protective layers 13 and 14 are formed of an insulation material, for example, an oxide film (SiO) or a nitride film (SiN).

The width of the insulation layer 15 formed in the first semiconductor base substrate 11 is preferably in the range from 50 nm to 1000 nm. When the width of the insulation layer is equal to or less than 50 nm, it is difficult to ensure the insulation property between the through electrode 17 and the first semiconductor base substrate 11. When the width of the insulation layer is equal to or greater than 1000 nm, a time taken to embed the insulation layer 15 may increase, thereby deteriorating productivity. Further, a slit occurs inside the insulation layer 15, and thus there is a danger that the entire insulation layer 15 is etched particularly by a chemical such as fluonitric acid used in a process of thinning the first semiconductor base substrate 11.

In addition, the insulation layer 15 may be formed of a material, such as a nitride film (SiN), an oxide film (SiO), or a combination of SiN and polysilicon, which can be embedded in a groove with a width of 50 nm to 1000 nm formed by dry etching.

Figure 3:
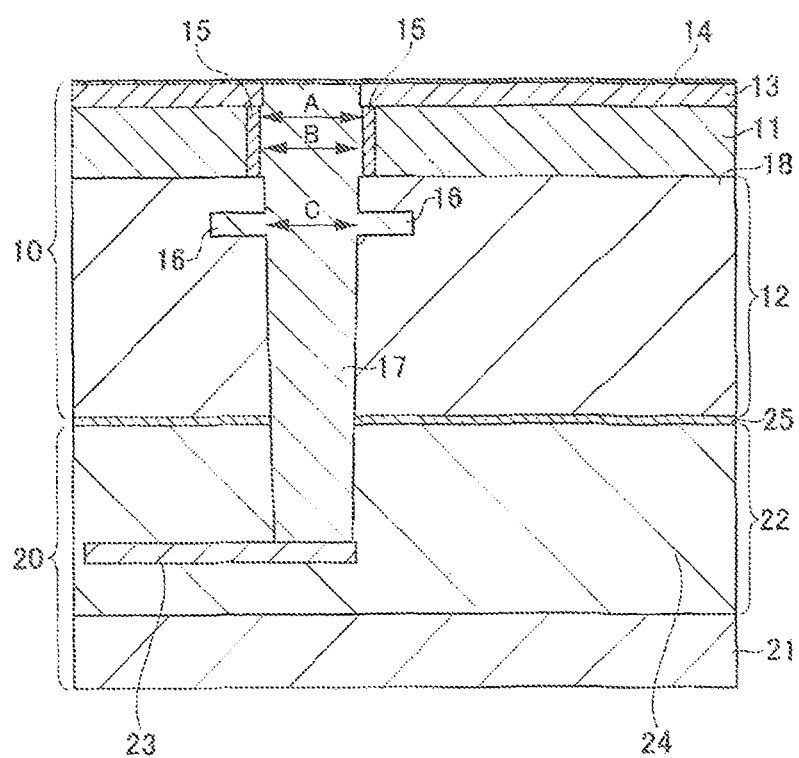
FIG. 3 is a sectional view illustrating the configuration of the semiconductor device according to the first embodiment.

In addition, a relation between the width of the through electrode 17 and opening widths of the insulation layer 15 and the first electrode pad 16 is illustrated in FIG. 3. As illustrated in FIG. 3, "A" is assumed to be the length of the inside of the insulation layer 15 formed in the first semiconductor base substrate 11. Further, "B" is assumed to be the width of the opening portion of the through electrode 17. Furthermore, "C" is assumed to be the opening width of the first electrode pad 16.

The opening width C of the first electrode pad 16 is preferably equal to or less than the opening portion B of the through electrode 17. When the opening width C of the first electrode pad 16 is greater than the opening portion B of the through electrode 17, it is difficult to bring the first electrode pad 16 in contact with the side surface of the through electrode 17, and thus it is difficult to ensure the electric conduction.

In addition, when the opening width C of the first electrode pad 16 is considerably less than the opening portion B of the through electrode 17, there is a probability that etching may not be performed up to the second electrode pad 23 of the second chip 20 when the opening portion is formed by dry etching in the process of forming the through electrode 17. Therefore, a difference between the opening width C and the opening portion B is set to be preferably 1 µm or less.

That is, the relation between the opening width C of the first electrode pad 16 and the opening portion B of the through electrode 17 preferably satisfies (B−1 µm)<C≤B.

Further, the length A of the inside of the insulation layer 15 is set to be preferably greater than the opening portion B of the through electrode 17. When the length A of the inside of the insulation layer 15 is less than the width B of the opening portion of the through electrode 17, there is a probability that etching may be not performed up to the second electrode pad 23 of the second chip 20 when the opening portion is formed by dry etching in a process of forming the through electrode 17.

In addition, the difference between the length A of the inside of the insulation layer 15 and the opening portion B of the through electrode 17 is set to be preferably less than 0.5 µm. By setting the difference to be less than 0.5 µm, a seed layer can be prevented from being cut when electrolytic plating is performed inside the opening portion in the process of forming the through electrode 17, and therefore, the plating property of the through electrode 17 is improved.

That is, the relation between the opening portion B of the through electrode 17 and the length A of the inside of the insulation layer 15 preferably satisfies (B−0.5 µm)<A.

In the semiconductor device according to the above-described embodiment, the through electrode 17 is formed inside the region surrounded by the insulation layer 15 in the first semiconductor base substrate 11. In addition, the insulation layer 15 surrounding the through electrode 17 in the first semiconductor base substrate 11 is not formed in the wiring layers 12 and 22. That is, the through electrode 17 is configured to come in direct contact with the inter-layer insulation layers 18 and 24 forming the wiring layers 12 and 22. In addition, since the side surface of the through electrode 17 in the wiring layers 12 and 22 is not covered with an insulation layer other than the inter-layer insulation layers 18 and 24, the side surface of the through electrode 17 can be electrically connected directly to the conductive layers such as wirings, electrodes, or the like formed in the wiring layers 12 and 22.

Thus, the through electrode 17 having the above-described configuration does not come into contact with the semiconductor base substrate with the insulation layer interleaved therebetween, and can come in direct contact with the inter-layer insulation layers and the conductive layers in the wiring layers.

A through electrode according to the related art has a configuration in which an insulation layer is continuously formed in the periphery of the through electrode from the surface of a semiconductor base substrate to a wiring layer, and thus the side surface of the through electrode may not be brought in direct contact with a conductive layer in the wiring layer. Therefore, since a through electrode extracting an electrode of a first chip to the surface of the semiconductor base substrate and a through electrode extracting an electrode of a second chip to the surface of the semiconductor base substrate are provided, it is necessary for wiring to connect the two through electrodes on the surface of the semiconductor base substrate (see Patent Literature 1 described above).

On the other hand, in the semiconductor device including the through electrode of this example, however, the connection between the first electrode pad 16 of the first chip 10 and the second electrode pad 23 of the second chip 20 can be realized by one through electrode 17. Therefore, it is possible to shorten the process of forming the through electrode. Further, since the number of through electrodes can be reduced, it is possible to improve the degree of freedom of design due to a decrease in the occupation area of the through electrode. Furthermore, since the number of through electrodes can be reduced, it is possible to prevent the wiring capacity from increasing.

In addition, in the semiconductor devices according to the related art in which a through electrode is formed in a semiconductor base substrate inside a region of an insulation film formed in advance, only a barrier metal is configured to be formed on the interface between the through electrode and the semiconductor base substrate (see Patent Literatures 2 and 3 described above). In the semiconductor device having this configuration, since an insulation layer is not formed on the interface between the through electrode and the semiconductor base substrate, the through electrode is configured to come in contact with the semiconductor base substrate via the barrier metal. In this configuration, a variation in the thickness of the barrier metal occurs when the through electrode with a high aspect ratio of a diameter to a depth is formed. In the barrier metal with low regularity, reaction occurs between the through electrode and a semiconductor base substrate in a portion in which the barrier metal is thin in an annealing or sintering process after the through electrode is embedded. For example, when heat history of 400° C. or more is added in the annealing or sintering process, a silicide reaction occurs between silicon (Si) of the semiconductor base substrate and copper (Cu) of the through electrode.

On the other hand, in the semiconductor device including the through electrode of this example, however, the insulation layer 15 is formed on the side surface of the through electrode 17 in the first semiconductor base substrate 11 in which the through electrode 17 is formed. Therefore, a reaction such as a silicide reaction can be suppressed between the through electrode 17 and the first semiconductor base substrate 11. In addition, since the through electrode 17 comes in contact with the inter-layer insulation layer in the wiring layers 12 and 22, the silicide reaction does not occur. Thus, even when the heat history of 400° C. or more is added in the annealing or sintering process, it is possible to suppress reaction, such as the silicide reaction of the through electrode 17, in which the reliability of wiring deteriorates. Accordingly, an improvement in the reliability of the through electrode 17 to a thermal process can be compatible with an improvement in transistor characteristics in the sintering process.

Note that, when the through electrode 17 is formed of a material such as Cu, a barrier metal layer that is not illustrated is formed on the side surface and the bottom surface of the through electrode 17 to prevent diffusion of the material into the insulation layer 15 and the inter-layer insulation layers 18 and 24. Even when the barrier metal layer is formed, as described above, the first electrode pad 16 is configured to be electrically connected to the second electrode pad 23 with the barrier metal layer interposed therebetween.

In addition, in the above-described embodiment, the planar arrangement of the through electrode and the insulation layer has a circular shape, but the present technology is not limited to the circular shape, and arbitrary shape such a rectangular shape or other polygonal shapes may be used. Further, the first electrode pad has the shape in which the opening with the same shape as that of the through electrode is formed, however, the shape of the first electrode pad is not particularly limited as long as the shape of the first electrode pad is a shape connectable with the through electrode. For example, a wiring shape extending only in one direction from the connection portion with the side surface of the through electrode may be used. In the shape in which the opening with the same shape as that of the through electrode is formed, the contact with the first electrode pad on the entire side surface of the through electrode can be realized, and thus connection reliability between the through electrode and the first electrode pad is improved.

<2. Method of Manufacturing a Semiconductor Device According to the First Embodiment>

Next, an example of a method of manufacturing the semiconductor device according to the first embodiment will be described. In the following description of the manufacturing method, only the method of manufacturing the configuration of the through electrode and the periphery of the through electrode of the semiconductor device illustrated in FIG. 1 described above will be described. The description of the method of manufacturing the configuration of the other elements or wirings or the like will be omitted. The semiconductor base substrates, the wiring layer, the other various kinds of transistors, various elements, and the like can be manufactured according to methods of the related art. In addition, the same reference numerals are given to the constituent elements of the same configurations of those of the semiconductor device of the present embodiment illustrated in FIG. 1, and the detailed description of such configurations will be omitted.

Figure 4A:
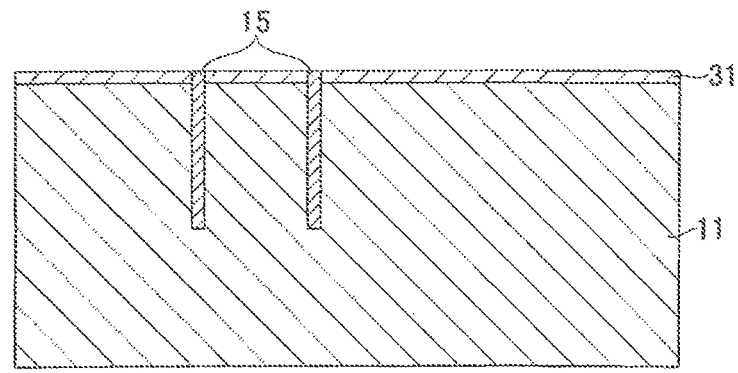
FIGS. 4A and 4B are diagrams illustrating processes of manufacturing the semiconductor device according to the first embodiment.

First, as illustrated in FIG. 4A, a hard mask layer 31 is formed on the first surface of the first semiconductor base substrate 11, and the insulation layer 15 is formed on the surface on the first surface side of the first semiconductor base substrate 11.

The hard mask layer 31 formed of $SiO_2$, SiN, or the like is formed on the first surface of the first semiconductor base substrate 11. Then, a resist that is not illustrated is formed on the hard mask layer 31, and then the resist is patterned using photolithography. The resist is formed in a pattern in which the shape of the insulation layer 15 formed in the first semiconductor base substrate 11 is opened. Further, the hard mask layer 31 is subjected to dry etching using the patterned resist as a mask. After the dry etching, the resist is removed and cleaned. Then, the surface of the first semiconductor base substrate 11 is opened by dry etching using the hard mask layer 31 as a mask to form an opening portion (groove). Thereafter, a nitride film (SiN), an oxide film (SiO), a combination of SiN and polysilicon, or the like is embedded in the formed opening portion to form the insulation layer 15.

The opening portion of the first semiconductor base substrate 11 in which the insulation layer 15 is formed is formed such that its width is, for example, in the range from 50 nm to 1000 nm. When the width of the opening portion is equal to or less than 50 nm, it is difficult to ensure the insulation property between the through electrode 17 and the first semiconductor base substrate 11. When the width of the opening portion is equal to or greater than 1000 nm, it takes a long time to embed the insulation layer 15. Further, a slit occurs inside the insulation layer 15, and thus there is a danger that the entire insulation layer 15 is etched particularly by a chemical, for example, fluonitric acid used in a process of thinning the first semiconductor base substrate 11.

In addition, the depth (the depth of the opening portion) at which the insulation layer 15 is formed is set to be equal to or greater than the thickness of the first semiconductor base substrate 11 after the thinning. By forming the insulation layer 15 to have the thickness equal to or greater than that after the thinning, the insulation layer 15 is formed in the entire region in the depth direction of the first semiconductor base substrate 11.

The insulation layer 15 may be formed of a material which can be embedded in the opening portion with a width in the range from 50 nm to 1000 nm by dry etching. In addition, a method capable of embedding the insulation layer 15 in the opening processed by a P-CVD, spin coating, or the like may be used as the method of embedding the insulation layer 15.

Figure 4B:
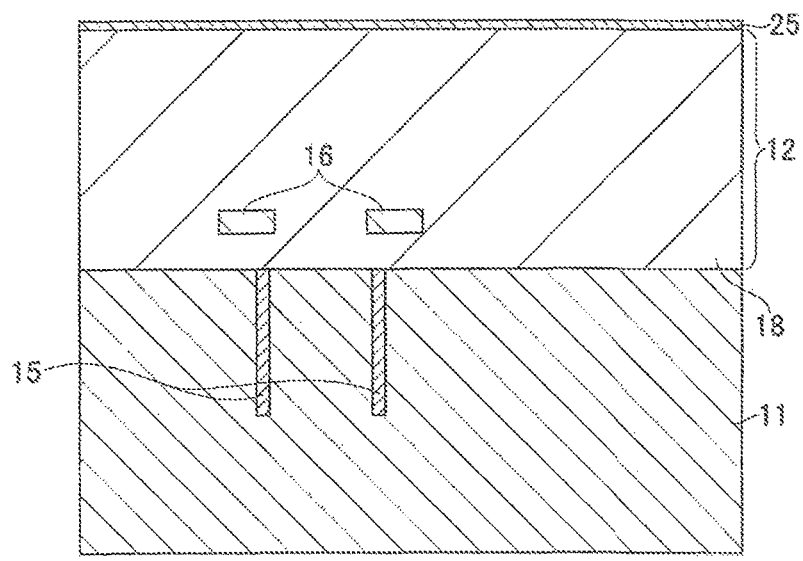

Next, as illustrated in FIG. 4B, the wiring layer 12 is formed on the first semiconductor base substrate 11. In addition, before the wiring layer 12 is formed, circuits such as transistors that are not illustrated are formed on the first surface of the first semiconductor base substrate 11.

The multi-layer wiring layer including the plurality of conductive layers and the inter-layer insulation layers is formed in the wiring layer 12. Here, the first electrode pad 16 including at least one conductive layer and the inter-layer insulation layer 18 including at least two layers are formed.

The first electrode pad 16 is formed to include the opening with the same shape as that of the through electrode 17. The opening width of the first electrode pad 16 is formed to satisfy, for example, the above-described relation of (B−1 μm)<C≤B between the opening width C of the first electrode pad 16 and the opening portion B of the through electrode pad 17.

Further, as illustrated in FIG. 4B, the surface of the wiring layer 12 is flattened through a CMP method or the like to form the bonding surface 25. The CMP is performed under the conditions generally used to manufacture a semiconductor device. For example, a CMP pad in which soft and hard materials are stacked, slurry (chemical), or the like generally used to manufacture a semiconductor device is used.

Next, the second semiconductor base substrate 21 in which a predetermined circuit serving as the second chip 20 is formed in advance is prepared. In the second semiconductor base substrate 21, the second electrode pad 23 at a position corresponding to the formation position of the through electrode 17 is prepared in the wiring layer 22. In addition, the bonding surface 25 flattened as in the wiring layer 12 of the first semiconductor base substrate 11 is formed on the surface of the wiring layer 22.

Figure 5C:
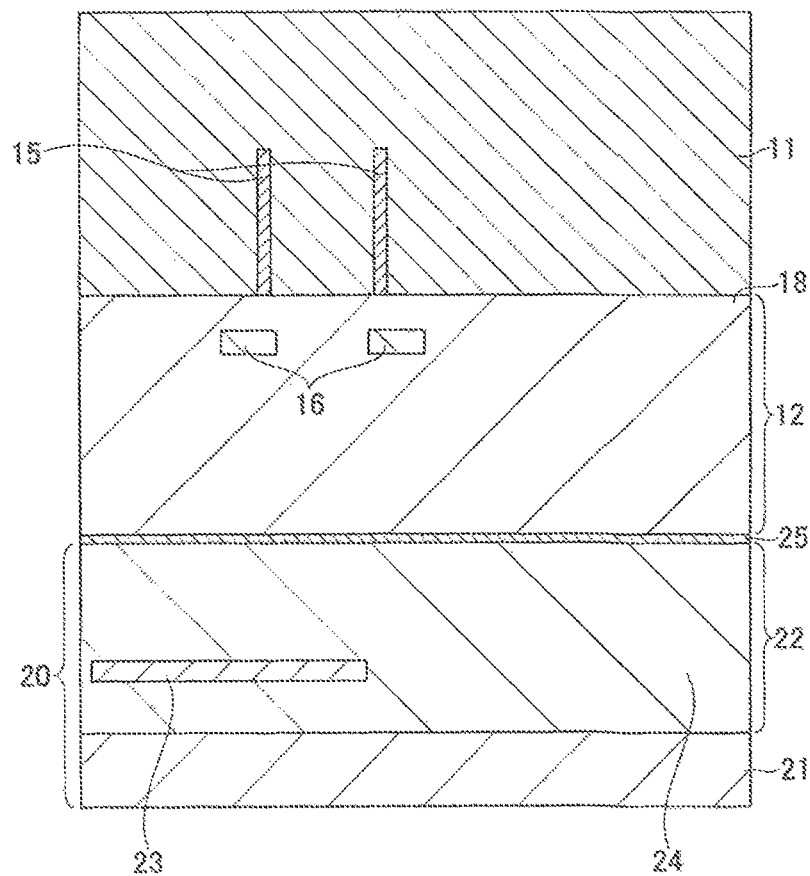
FIGS. 5C and 5D are diagrams illustrating processes of manufacturing the semiconductor device according to the first embodiment.

In addition, as illustrated in FIG. 5C, the first semiconductor base substrate 11 is turned over so that the surface of the wiring layer 12 of the first semiconductor base substrate 11 faces the surface of the wiring layer 22 of the second semiconductor base substrate 21. Then, the wiring layers 12 and 22 of the first semiconductor base substrate 11 and the second semiconductor base substrate 21 are brought in contact with each other to be bonded by pressing down the first semiconductor base substrate and the second semiconductor base substrate with pins.

The bonding is performed by juxtaposing the first semiconductor base substrate 11 with the second semiconductor base substrate 21 without preprocessing immediately after the CMP and pressing down the centers of the first semiconductor base substrate 11 and the second semiconductor base substrate 21.

In the bonding process, for example, the pins of which contact surfaces with the first semiconductor base substrate 11 and the second semiconductor base substrate 21 have a circular shape are used. A pressing load is set to, for example, 12 N.

Figure 5D:
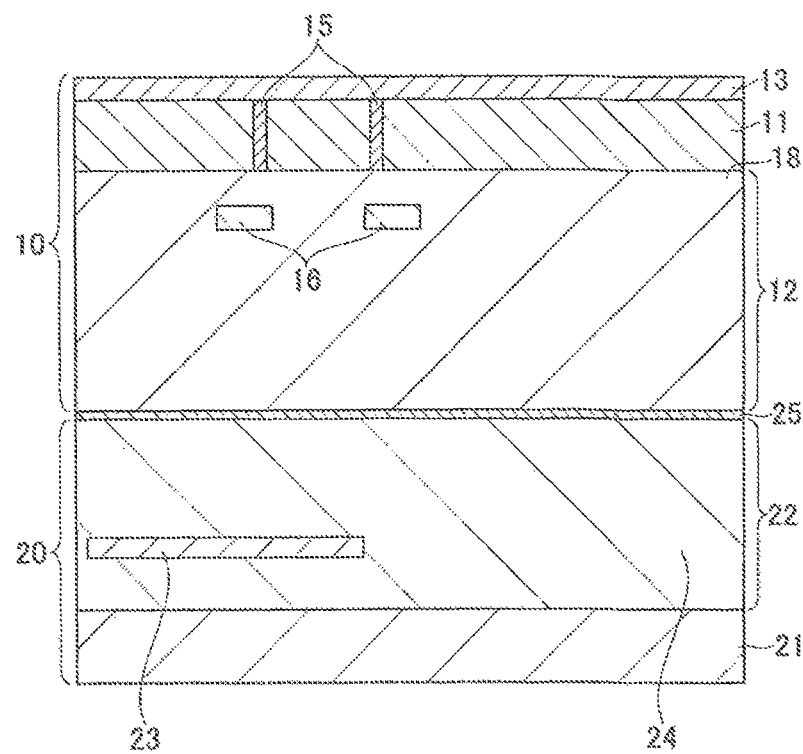

Next, as illustrated in FIG. 5D, the second surface side of the first semiconductor base substrate 11 is polished to thin the first semiconductor base substrate 11. The first semiconductor base substrate 11 is polished up to a predetermined thickness at which the insulation layer 15 is exposed from the second surface side.

Further, a film of SiN, SiO$_2$, or the like is formed on the second surface of the first semiconductor base substrate 11 subjected to the thinning to form the protective layer 13.

Figure 6E:
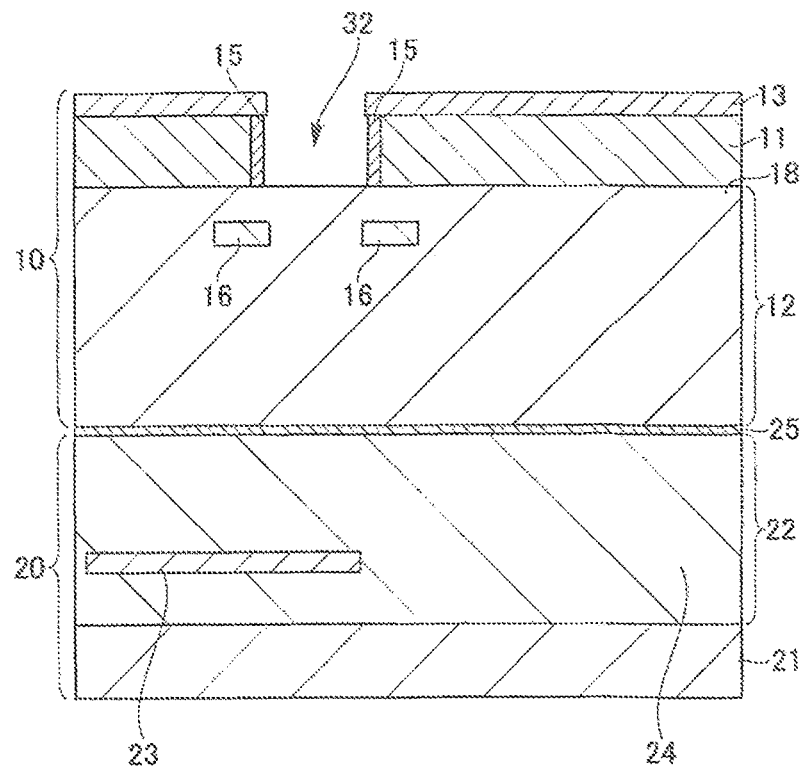
FIGS. 6E and 6F are diagrams illustrating processes of manufacturing the semiconductor device according to the first embodiment.

Next, as illustrated in FIG. 6E, a portion surrounded by the insulation layer 15 of the first semiconductor base substrate 11 is removed to completely expose the inner surface of the previously formed insulation layer 15. Through this process, an opening portion 32 is formed in the portion surrounded by the insulation layer 15 of the first semiconductor base substrate 11.

The opening portion 32 can be formed through the same process as the process of forming the opening portion (groove) in which the above-described insulation layer 15 is embedded. For example, as illustrated in FIG. 8A, a resist pattern is formed on the protective layer 13 through photolithography, a hard mask pattern of the protective layer 13 is formed using the resist pattern, and then the first semiconductor base substrate 11 is subjected to dry etching.

Here, as illustrated in FIG. 3 described above, the relation between the opening portion B of the through electrode 17 and the length A of the inside of the insulation layer 15 formed in the first semiconductor base substrate 11 preferably satisfies (B−0.5 µm)<A. Therefore, the width of the opening portion formed in the protective layer 13 is less than the width of the inside of the insulation layer 15. As a result, as illustrated in FIG. 8A, a first semiconductor base substrate 11A remains on the inner surface within the region surrounded by the insulation layer 15 in the dry etching in which isotropy is high. When the first semiconductor base substrate 11A remains on the inner side of the insulation layer 15, a silicide reaction occurs in the through electrode 17, thereby deteriorating reliability of the through electrode 17. For this reason, the entire first semiconductor base substrate 11 is preferably removed on the inner side of the insulation layer 15.

Figure 8A:
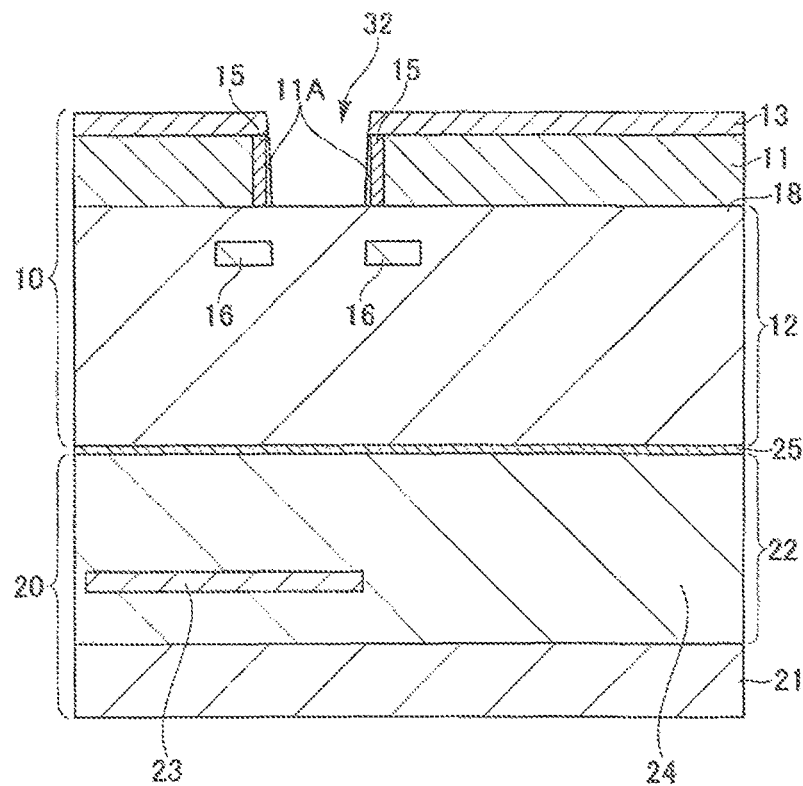
FIGS. 8A and 8B are diagrams illustrating processes of manufacturing the semiconductor device according to the embodiment.
Figure 8B:
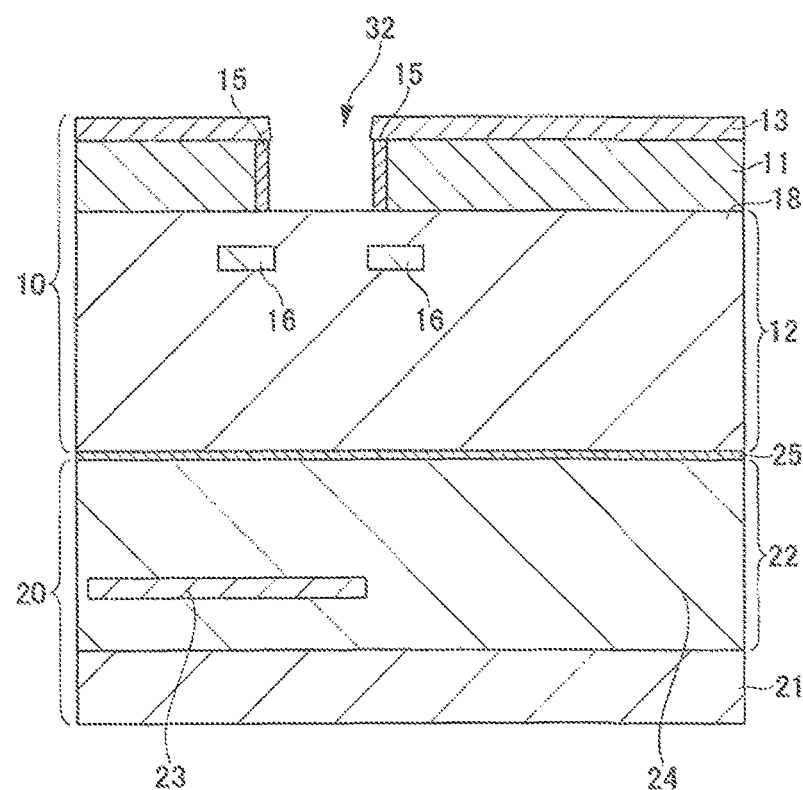

For example, after the etching illustrated in FIG. 8A, as illustrated in FIG. 8B, the first semiconductor base substrate 11A is removed on the inner side of the insulation layer 15 by isotropic etching and dry etching is performed so that the inner wall of the insulation layer 15 is entirely exposed. Thus, the opening portion 32 is formed so that the first semiconductor base substrate 11 does not remain between the inner side of the insulation layer 15 and the through electrode 17.

Figure 6F:
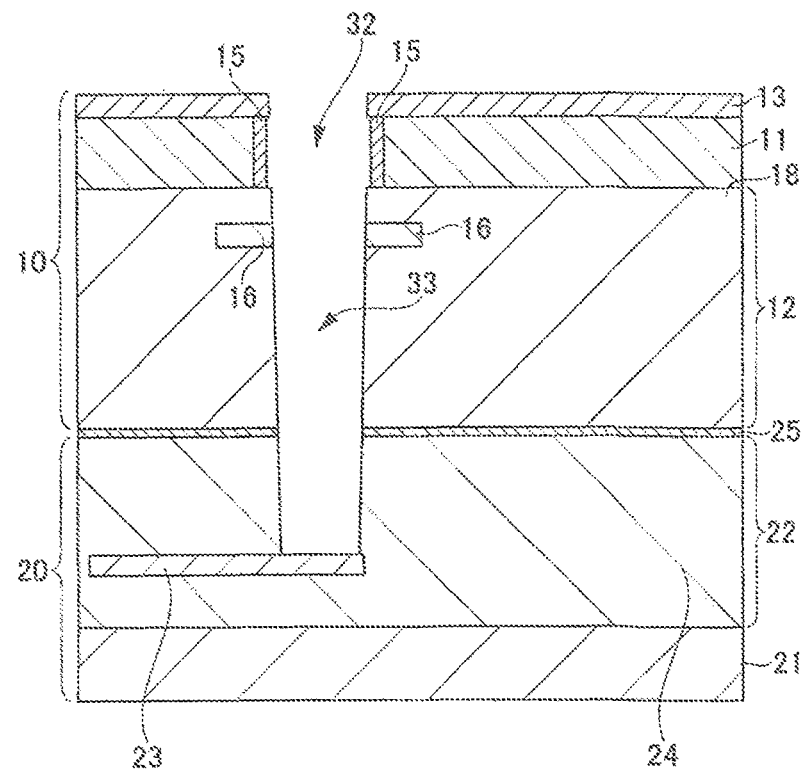

Next, as illustrated in FIG. 6F, a portion from the wiring layer 12 of the first chip 10 below the opening portion 32 to the second electrode pad 23 formed in the wiring layer 22 of the second chip 20 is opened by dry etching. Through this process, an opening portion 33 is formed. The opening portion 33 is formed inside the opening of the first electrode pad 16. In FIG. 6F, the opening width of the first electrode pad 16 is illustrated to be the same as the width of the opening portion 33, however, from the viewpoint of the above-described relation of (B−1 µm)<C≤B, the width of the opening portion 33 on the first electrode pad 16 may be greater than the opening width of the first electrode pad 16. Even in this case, the opening portion 33 below the first electrode pad 16 is formed with the opening width of the first electrode pad 16, since the first electrode pad 16 serves as a mask.

Figure 7G:
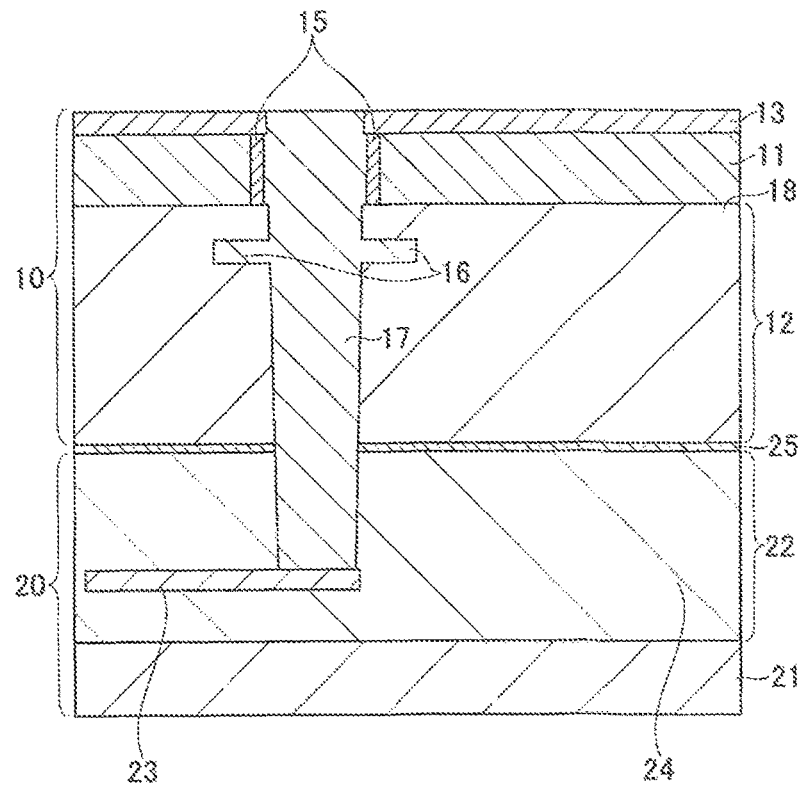
FIGS. 7G and 7H are diagrams illustrating processes of manufacturing the semiconductor device according to the embodiment.

Next, as illustrated in FIG. 7G, a conductive layer serving as the through electrode 17 is embedded inside the opening portions 32 and 33. For example, a seed metal layer formed of a lamination layer of tantalum (Ta) and copper, Ti/Cu, TiW/Cu, or the like is formed with a thickness of about 10 nm to about 35 nm inside the opening portions 32 and 33. Then, the opening portions 32 and 33 are filled through electrolytic Cu plating to form the through electrode 17. By forming the through electrode 17, the first electrode pad 16 on the side of the first chip 10 is electrically connected to the second electrode pad 23 on the side of the second chip 20.

Further, from the viewpoint of the above-described relation of (B−1 µm)<C≤B, the opening portion 33 is preferably formed such that the width of the opening portion 33 on the first electrode pad 16 may be greater than the opening width of the first electrode pad 16. Therefore, the through electrode 17 is preferably formed to have a shape in which its width on the first electrode pad 16 is greater than its width below the first electrode pad 16. By forming the through electrode 17 with this shape, it is possible to ensure connection reliability between the through electrode 17 and the first electrode pad 16 and connection reliability between the first electrode pad 16 and the second electrode pad 23 via the through electrode 17.

Figure 7H:
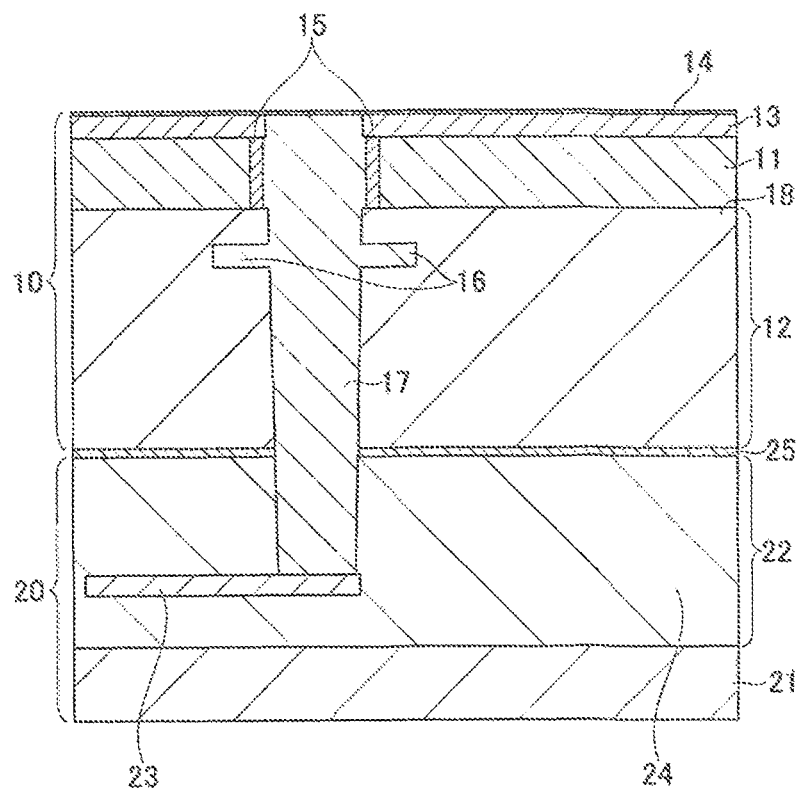

Thereafter, as illustrated in FIG. 7H, the barrier metal layer or the conductive layer formed on the second surface side of the first semiconductor base substrate 11 is removed, and then the protective layer 14 is formed to cover the upper surface of the through electrode 17 and the protective layer 13.

Through the above-described processes, it is possible to manufacture the semiconductor device according to the present embodiment.

Note that, after the above-described processes, the base substrate in the wafer state may be diced to divide the semiconductor device into pieces. In addition, in the above-described manufacturing method, both the first semiconductor base substrate 11 and the second semiconductor base substrate 21 are bonded in the state (wafer state) in which the semiconductor device is divided into pieces, however, the first chip 10 in the divided first semiconductor base substrate 11 may be bonded on the second semiconductor base substrate 21 in the wafer state, or may be bonded after each of the first semiconductor base substrate and the second semiconductor base substrate is divided into pieces.

The semiconductor device according to the above-described embodiment is applicable to any electronic device, for example, a solid-state imaging device, a semiconductor memory, or a semiconductor logic device (IC or the like), in which two semiconductor members are bonded and wiring bonding is performed.

<4. Semiconductor Device According to the Second Embodiment>

A semiconductor device including a through electrode according to the second embodiment will be described.

Figure 9:
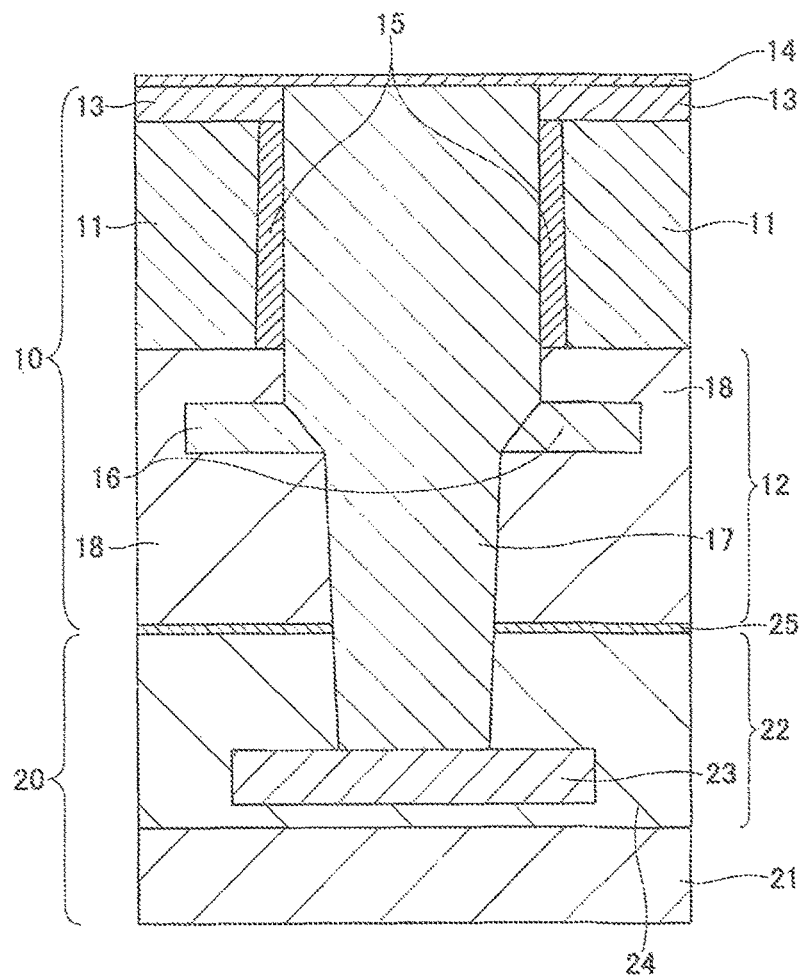
FIG. 9 is a sectional view illustrating a configuration of a semiconductor device according to a second embodiment.

FIG. 9 illustrates a schematic configuration of the semiconductor device including the through electrode according to this embodiment. FIG. 9 is a sectional view illustrating the semiconductor device near a region in which the through electrode is formed. Note that, in FIG. 9, only the schematic configuration near the region in which the through electrode is formed is illustrated, and each configuration of a semiconductor base substrate or each configuration in the periphery of the through electrode is not illustrated. In addition, the same reference numerals are given to the constituent elements of the same configurations of those of the semiconductor device of the first embodiment described above, and the detailed description will be omitted.

As shown in FIG. 9, the semiconductor device is configured such that the first chip 10 and the second chip 20 are bonded to each other. In addition, the through electrode 17 that penetrates from the second surface of the first semiconductor base substrate 11 to the second electrode pad 23 is included. The through electrode 17 is formed in the opening portion that penetrates the protective layer 13, the first semiconductor base substrate 11, and the wiring layers 12 and 22.

Note that the first chip 10 has the same configuration as in the first embodiment described above except for the configuration of the first electrode pad 16. In addition, the second chip 20 has the same configuration as in the first embodiment described above.

In the semiconductor device illustrated in FIG. 9, the inner surface of the opening portion of the first electrode pad 16 is formed such that the opening thereof on the second surface side of the first chip is large and the opening thereof on the first surface side is small. To be specific, the first electrode pad 16 is provided in a tapered shape so that the opening of the first surface side is small on the surface on which the first electrode pad 16 comes in contact with the through electrode 17.

Figure 10:
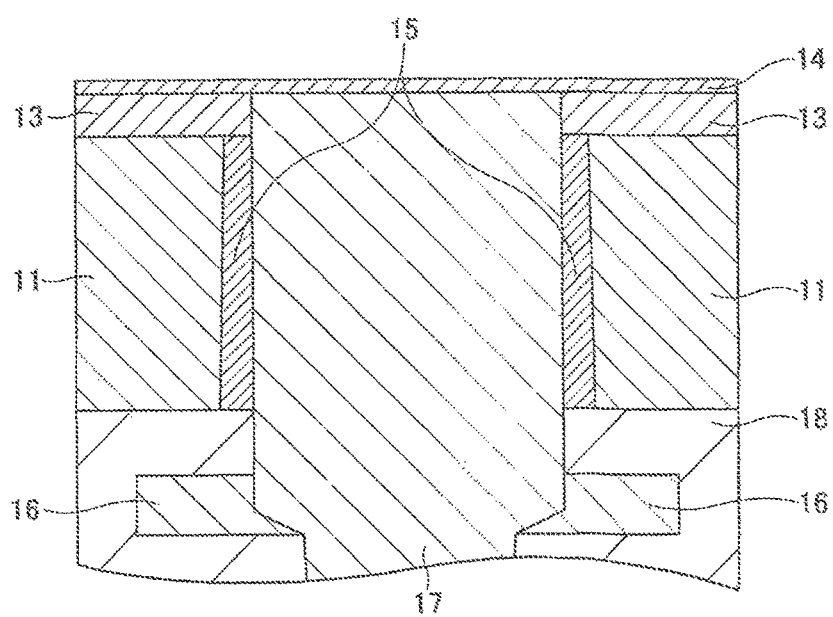
FIG. 10 is a sectional view illustrating a configuration of a first electrode pad of the semiconductor device according to the second embodiment.

In addition, the opening portion of the first electrode pad 16 may have a continuously decreasing shape as shown in FIG. 9, or may be configured to have the same size from the second surface side of the first chip to the middle of the opening portion and to be tapered from the middle of the opening portion to the first surface side as shown in FIG. 10. Note that FIG. 10 illustrates an enlarged configuration of the periphery of the first electrode pad 16 from the configuration of the semiconductor device illustrated in FIG. 9.

By providing an inclination on the inner surface of the opening portion of the first electrode pad 16, a contact area of the through electrode 17 and the first electrode pad 16 increases. As the size of the opening portion decreases on the first surface side of the first chip 10, poor contact attributable to deviation of the position of the opening hardly occurs. Due to the increase in the contact area as above, it is possible to reduce contact resistance between the electrodes and thereby to improve reliability of the semiconductor device.

In addition, a sectional area of the through electrode 17 on the second surface side of the first electrode pad 16 is preferably greater than the opening portion on the first surface side of the first electrode pad 16. By setting the sectional area of the through electrode 17 to be greater than that of the opening portion on the first surface side of the first electrode pad 16, contact between the through electrode 17 and the first electrode pad 16 is easily ensured even when the position of the opening is deviated. For this reason, poor contact between the through electrode 17 and the first electrode pad 16 or the like can be suppressed.

In addition, a sectional area of the through electrode 17 on the second surface side of the first electrode pad 16 is preferably greater than the opening portion on the second surface side of the first electrode pad 16. In this case, the contact between the through electrode 17 and the first electrode pad 16 is more easily ensured. For this reason, poor contact between the through electrode 17 and the first electrode pad 16 or the like can be further prevented from occurring.

Figure 11:
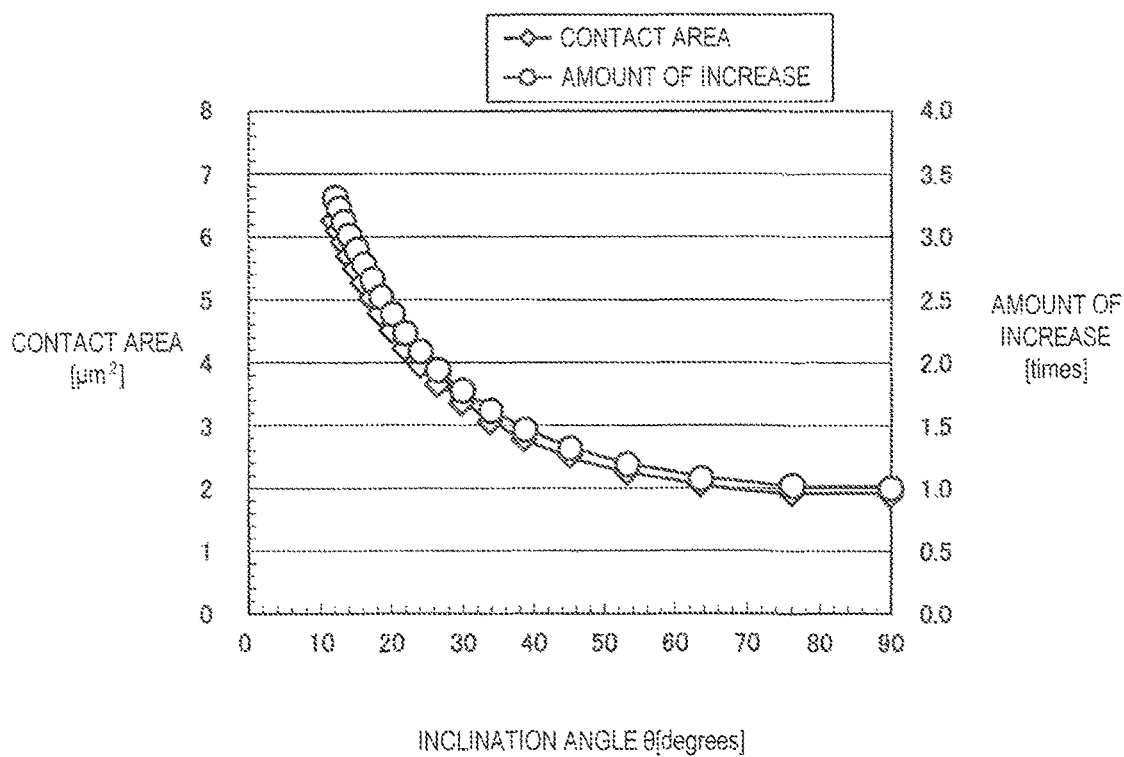
FIG. 11 is a graph showing a relation between an inclination angle and a contact surface angle of an opening portion of the first electrode pad 16.
Figure 12:
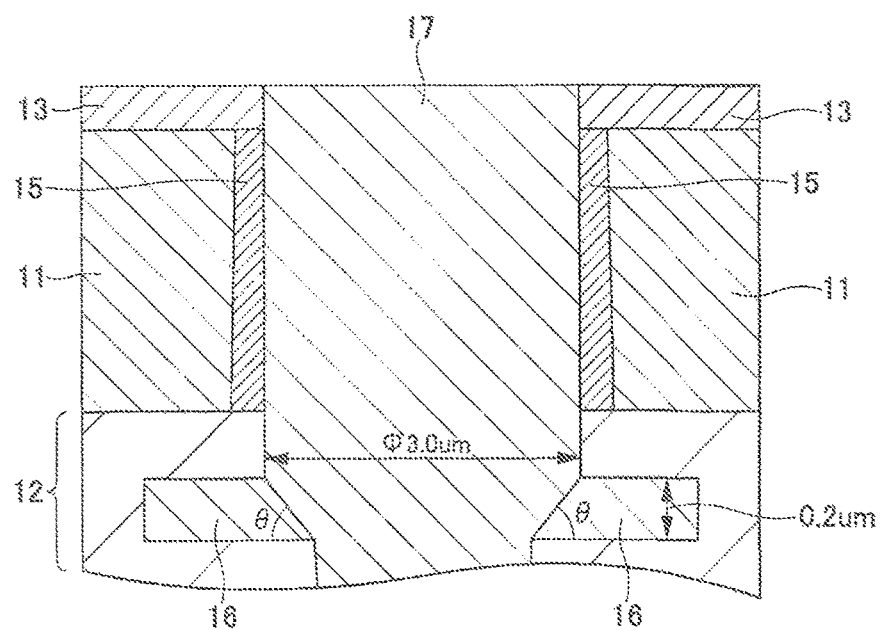
FIG. 12 is a diagram illustrating a configuration of the first electrode pad for obtaining the result shown in FIG. 11.

FIG. 11 illustrates an inclination angle θ and a contact area of the inner surface of the opening portion of the first electrode pad 16 and the relation between the contact angle θ and an amount of increase of the contact area. The amount of increase of the contact area is for a comparison to the configuration in which the inner surface of the first electrode pad 16 is set to be vertical (first embodiment) and is indicated by multiple numbers of the contact area when the inner surface is vertical. In addition, the relation illustrated in FIG. 11 provides numerical values of the configuration illustrated in FIG. 12. In the configuration illustrated in FIG. 12, the through electrode 17 is set to have a circular shape with an opening diameter (diameter) of 3 μm and a thickness of the first electrode pad 16 is set to be 0.2 μm.

As illustrated in FIG. 11, as the inclination angle of the opening portion of the first electrode pad 16 decreases, the contact area of the through electrode 17 and the first electrode pad 16 increases. By setting the inclination angle of the inner surface of the opening portion of the first electrode pad 16 to be 39° or lower, for example, the contact area becomes 1.5 times that of the configuration of the first embodiment or larger. In addition, by setting the inclination angle thereof to be 30° or lower, the contact area becomes 2 times that of the configuration of the first embodiment or larger.

In addition, by providing the inclination in the inner surface of the first electrode pad 16, the covering property of the barrier metal layer improves more than the configuration in which the inner surface of the first electrode pad 16 is set to be vertical (first embodiment). For this reason, the thickness of the barrier metal layer to be formed can be reduced, and contact resistance between the through electrode 17 and the first electrode pad 16 can be lessened.

<5. Method of Manufacturing a Semiconductor Device According to the Second Embodiment>

Next, an example of a method of manufacturing the semiconductor device according to the second embodiment will be described. Note that, in the following description of the manufacturing method, only the method of manufacturing the configuration of the through electrode and the periphery of the through electrode of the semiconductor device illustrated in FIG. 9 described above will be described, and the description of the method of manufacturing the configuration of the other elements or wirings or the like will be omitted. The semiconductor base substrates, the wiring layer, the other various kinds of transistors, various elements, and the like can be manufactured according to methods of the related art. In addition, detailed description of the configuration of the semiconductor device of the first embodiment described above, the configuration and the operation described in the manufacturing method, and the like will be omitted.

First, using the same method as in the first embodiment described above, steps up to the step of removing the portion surrounded by the insulation layer 15 of the first semiconductor base substrate 11 and forming the opening portion 32 in the portion surrounded by the insulation layer 15 of the first semiconductor base substrate 11 illustrated in FIG. 6E are performed.

Figure 13F:
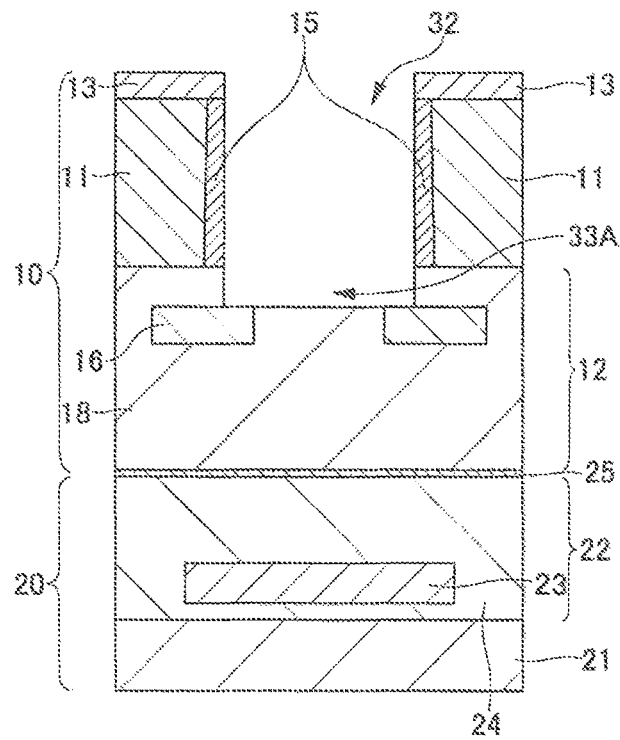
FIGS. 13F and 13G are diagrams illustrating processes of manufacturing the semiconductor device according to the second embodiment.

Next, only a portion of the inter-layer insulation layer 18 provided in the lower layer of the first electrode pad 16 (on the first semiconductor base substrate 11 side) is opened through dry etching to form an opening portion 33A as illustrated in FIG. 13F. The opening width at that time is preferably set to be a width greater than that of the opening portion of the first electrode pad 16. Further, it is necessary to expose the first electrode pad 16 from a circumference of the bottom portion of the opening portion 33A. Particularly, a configuration in which the inside of the first electrode pad 16 is exposed from the entire circumference of the bottom portion of the opening portion 33A is preferable.

Figure 13G:
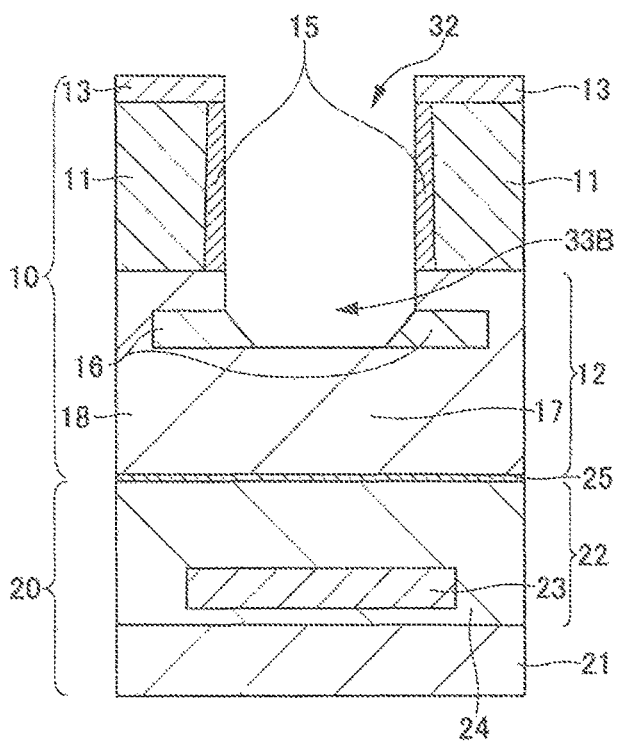

Next, the first electrode pad 16 that is exposed from the opening portion 33A and the inter-layer insulation layer 18 on the inner side of the first electrode pad 16 are removed through dry etching as illustrated in FIG. 13G. Accordingly, an opening portion 33B is formed to the depth of the upper end of the first electrode pad 16 (on the bonding surface side). At this time, by adjusting a condition of the dry etching, the first electrode pad 16 and the inter-layer insulation layer 18 are removed at the same time, and the inner surface of the first electrode pad 16 is processed to be an inclined surface.

Under a condition of dry etching for an insulation layer such as a general oxide film for forming the inter-layer insulation layer 18, the first electrode pad 16 is etched like the inter-layer insulation layer 18. For this reason, the inner surface of the opening portion of the first electrode pad 16 is shaped vertically as in the first embodiment.

Thus, in order to process the inner surface of the opening portion of the first electrode pad 16 to be an inclined surface in the present embodiment, a processing condition that Ar not be used is applied in the step of removing the first electrode pad 16 and the inter-layer insulation layer 18 illustrated in FIG. 13G.

If Ar is not used in dry etching, a sputtering effect with respect to a metal such as Cu composing the first electrode pad 16 becomes weak, and thus a selectivity of the first electrode pad 16 and the inter-layer insulation layer 18 increases. For this reason, dry etching progresses to cause the inner surface of the opening portion of the first electrode pad 16 to incline. Here, the shape of the inclined surface including an inclination angle and the like can be controlled generally based on a ratio of oxygen used in dry etching.

By performing dry etching based on a change in the condition or a combination of various conditions as above, only a portion of the first electrode pad 16 can be processed so as to provide the inclined surface as in the configuration illustrated in FIG. 10 described above. In addition, by appropriately changing conditions of dry etching, the inner surface of the opening portion of the first electrode pad 16 can be processed to be an arbitrary inclined surface.

Figure 14H:
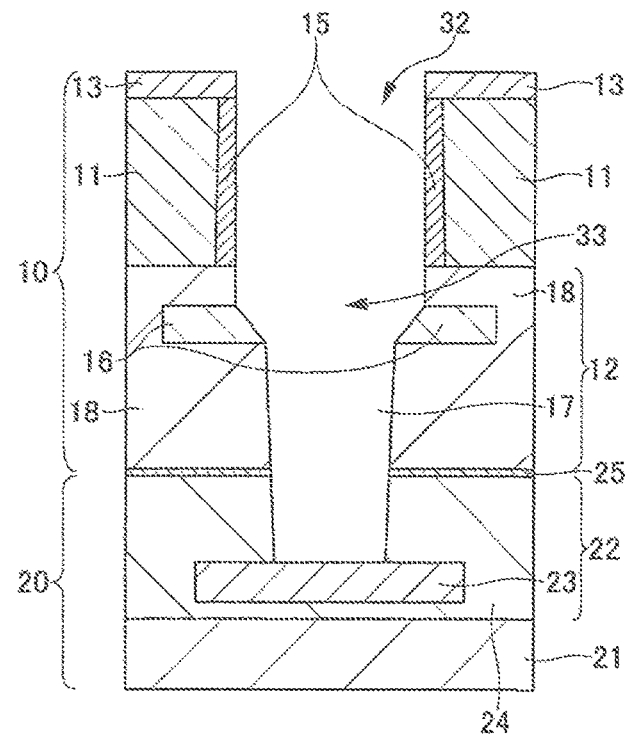
FIGS. 14H and 14I are diagrams illustrating processes of manufacturing the semiconductor device according to the second embodiment.

Next, the portion from the upper end of the first electrode pad 16 (on the bonding surface side) to the second electrode pad 23 provided in the wiring layer 22 of the second chip 20 is open through dry etching as illustrated in FIG. 14H. The dry etching is performed under the condition that it not affect the inclination shape of the opening portion of the first electrode pad 16. Accordingly, the opening portion 33 can be formed from the first electrode pad 16 to the second electrode pad 23 with the opening width of the upper end of the first electrode pad 16 (on the bonding surface side)

Figure 14I:
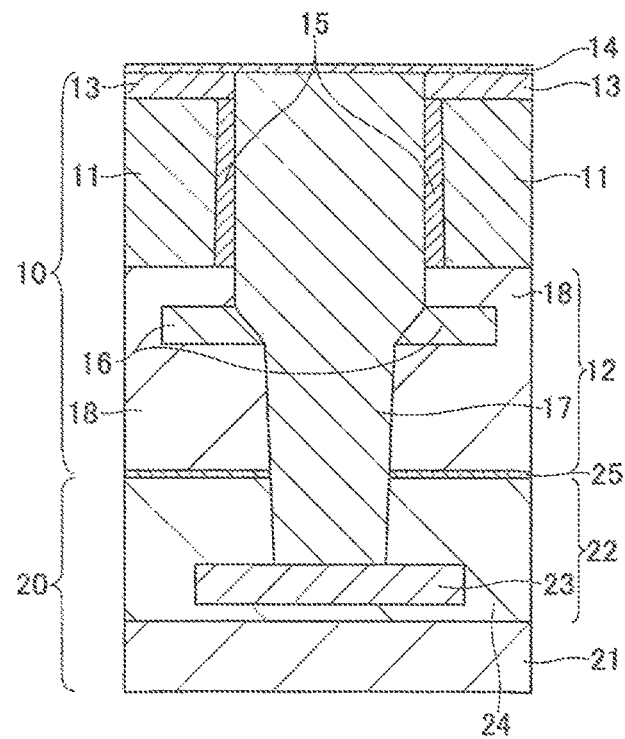

Next, as illustrated in FIG. 14I, after the through electrode 17 is formed inside the opening portion, the protective layer 14 is formed. This step can be performed using the same method as the step illustrated in FIGS. 7G and 7H in the manufacturing method of the semiconductor device of the first embodiment described above.

In the manufacturing method described above, the step of processing the inner surface of the opening portion of the first electrode pad 16 to be an inclined surface is included. In this step, it is possible to increase the area of the inner surface of the opening portion of the first electrode pad 16. By shaping the opening portion of the first electrode pad 16 to be the inclined surface as above, connection reliability improves even when positional deviation in the position of a resist pattern occurs in lithography performed in each drawing of the step illustrated in FIG. 13F, the step illustrated in FIG. 13G, and the step illustrated in FIG. 14H. For this reason, with respect to deviation in the positions of the first electrode pad 16 and the through electrode 17, a reduction in the connection area can be suppressed, and thus connection resistance can be reduced.

Further, by increasing the connection area, the area of the barrier metal layer serving as the interface of the first electrode pad 16 and the through electrode 17 increases more than in the configuration in which the inner surface of the first electrode pad 16 is set to be vertical (first embodiment). For this reason, the adhesion property of the first electrode pad 16 and the through electrode 17 improves, and the connection reliability accordingly improves.

In addition, by increasing the area of the barrier metal layer, the covering property of the barrier metal layer improves. Thus, the thickness of the barrier metal layer to be formed can be reduced, and thus connection resistance between the through electrode 17 and the first electrode pad 16 can be accordingly reduced.

According to the semiconductor device of the present embodiment described above, by providing the inclined surface in the inner surface of the opening portion of the first electrode pad 16, the reduction in the contact resistance between electrodes and improvement in reliability of the semiconductor device are possible. Therefore, the semiconductor device having high performance, high function, and high reliability can be provided.

<6. Semiconductor Device According to the Third Embodiment>

A semiconductor device including a through electrode according to the third embodiment will be described.

Figure 15:
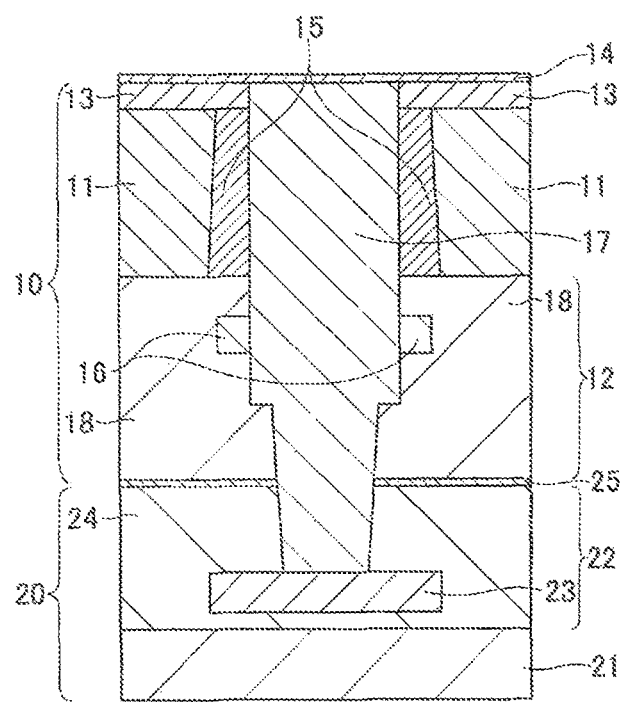
FIG. 15 is a sectional view illustrating a configuration of a semiconductor device according to a third embodiment.

FIG. 15 illustrates a schematic configuration of the semiconductor device including the through electrode according to the present embodiment. FIG. 15 is a sectional view illustrating the semiconductor device near a region in which the through electrode is formed. In FIG. 15, only the schematic configuration near the region in which the through electrode is formed is illustrated, and each configuration of a semiconductor base substrate or each configuration in the periphery of the through electrode is not illustrated. In addition, the same reference numerals are given to the constituent elements of the present embodiment with the same configurations as those of the semiconductor device of the first embodiment described above, and the detailed description will be omitted.

As illustrated in FIG. 15, the semiconductor device is configured by bonding the first chip 10 to the second chip 20. In addition, the through electrode 17 that penetrates from the second surface of the first semiconductor base substrate 11 to the second electrode pad 23 is included. The through electrode 17 is formed in the opening portion that penetrates the protective layer 13, the first semiconductor base substrate 11, and the wiring layers 12 and 22.

Note that the first chip 10 has the same configuration as that of the first embodiment described above except for the configuration of the insulation layer 15. In addition, the second chip 20 has the same configuration as that of the first embodiment described above.

In the semiconductor device illustrated in FIG. 15, the insulation layer 15 is formed of the same material as the inter-layer insulation layer 18 forming the wiring layer 12. It is formed of, for example, a single or laminated layer of a silicon dioxide film or a silicon nitride film.

The opening diameter of first semiconductor base substrate 11 on the first surface side is substantially the same as the opening diameter of the first electrode pad 16. In addition, the opening diameter of the first electrode pad 16 is greater than the diameter of the through electrode 17 coming in contact with the second electrode pad 23.

By setting the opening diameter of the first electrode pad 16 to be greater, the contact area of the through electrode 17 and the first electrode pad 16 can be increased. For this reason, even when the device is miniaturized, connection reliability of the through electrode 17 and the first electrode pad 16 can be enhanced.

<7. Method of Manufacturing Semiconductor Device According to the Third Embodiment>

Next, an example of a method of manufacturing the semiconductor device according to the third embodiment will be described. In the following description of the manufacturing method, only the method of manufacturing the configuration of the through electrode and the periphery of the through electrode of the semiconductor device illustrated in FIG. 9 described above will be described, and the description of the method of manufacturing the configuration of the other elements or wirings or the like will be omitted. The semiconductor base substrates, the wiring layer, the other various kinds of transistors, various elements, and the like can be manufactured according to methods of the related art. In addition, detailed description of the configuration of the semiconductor device of the first embodiment described above, the configuration and the operation described in the manufacturing method, and the like will be omitted.

First, using the same method as that of the first embodiment described above, steps up to the step of polishing the second surface side of the first semiconductor base substrate 11 and thinning the first semiconductor base substrate 11 illustrated in FIG. 5D are performed. At this time, the insulation layer 15 is formed to a thickness at which the inner diameter of the insulation layer 15 is smaller than the opening diameter in which the through electrode 17 is finally formed.

Figure 16E:
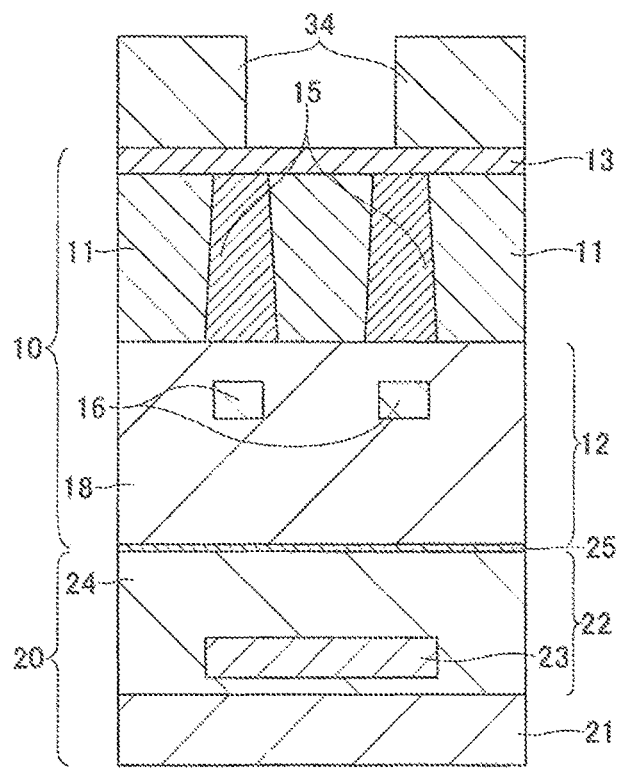
FIGS. 16E and 16F are diagrams illustrating processes of manufacturing the semiconductor device according to the third embodiment.

Next, as illustrated in FIG. 16E, a resist 34 is formed on the second surface of the first semiconductor base substrate 11, and the hole for forming the through electrode 17 is patterned using photolithography. At this time, in the resist 34, an opening with a diameter greater than the inner diameter of the insulation layer 15 is formed.

Figure 16F:
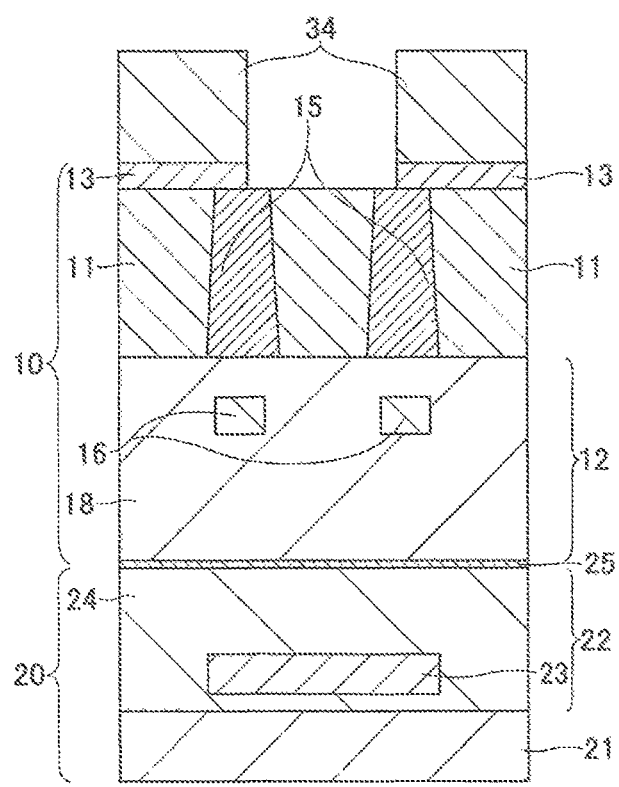

Next, as illustrated in FIG. 16F, the protective layer 13 is opened from the opening portion of the resist 34 using dry etching. Accordingly, parts of the first semiconductor base substrate 11 and the insulation layer 15 are exposed on the same surface.

Figure 17G:
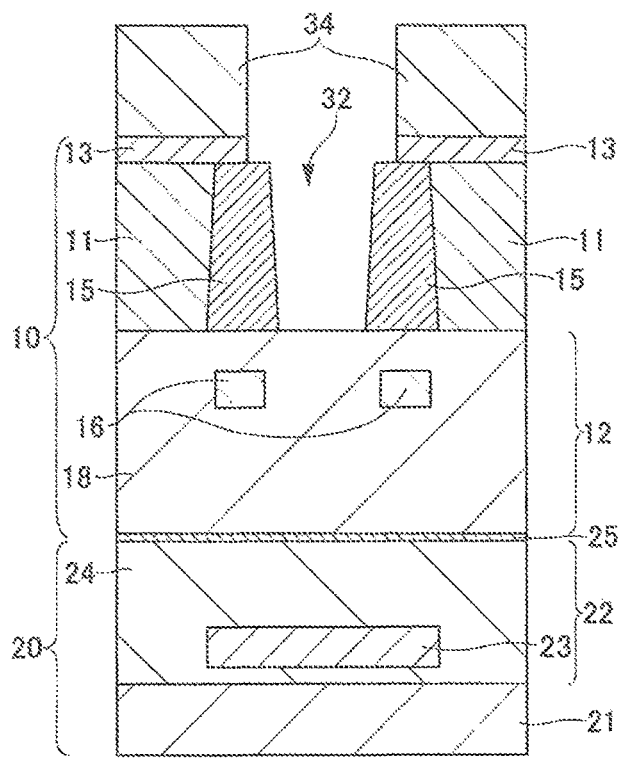
FIGS. 17G and 17H are diagrams illustrating processes of manufacturing the semiconductor device according to the third embodiment.

Next, as illustrated in FIG. 17G, selective etching of the first semiconductor base substrate 11 is performed using, for example, CF-based gas, thereby removing the first semiconductor base substrate 11 that has been exposed from the opening of the resist 34 completely. Accordingly, the opening portion 32 is formed.

Figure 17H:
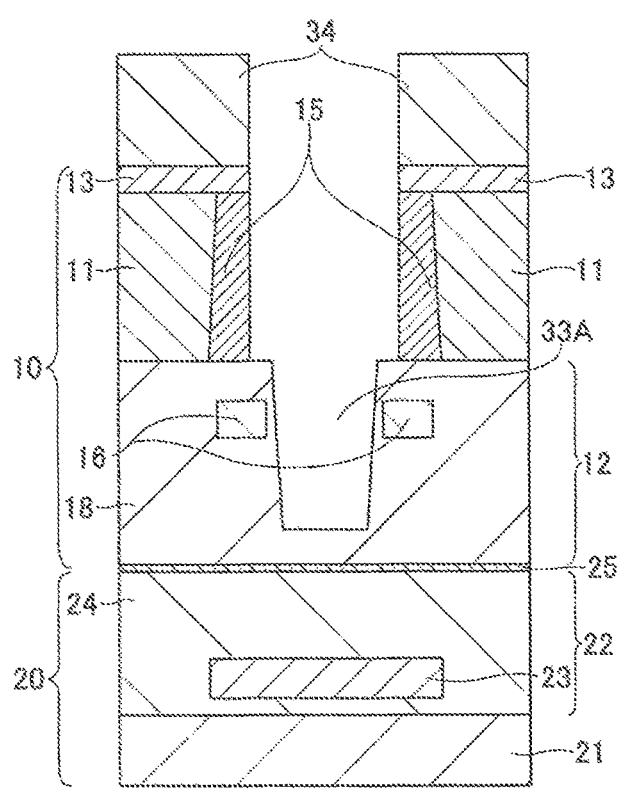
Figure 18I:
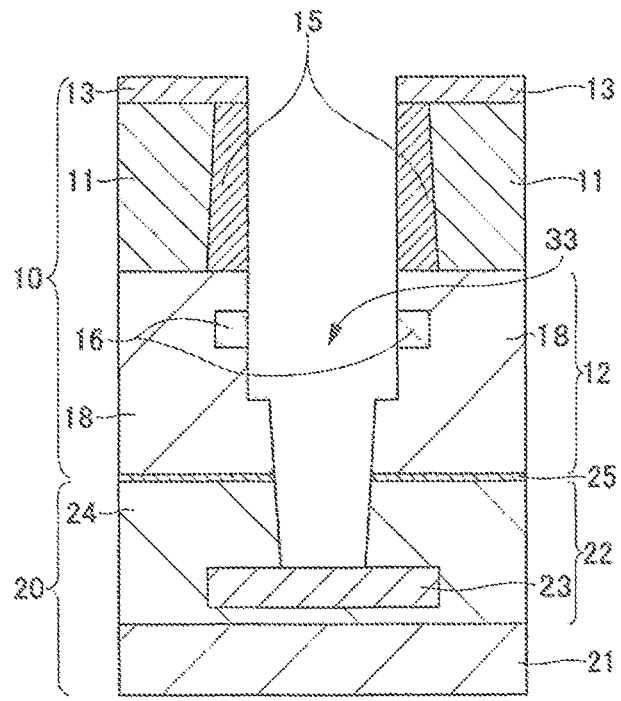
FIGS. 18I and 18J are diagrams illustrating processes of manufacturing the semiconductor device according to the third embodiment.

Next, as illustrated in FIG. 17H, the insulation layer 15 that is exposed from the opening of the resist 34 and the inter-layer insulation layer 18 are etched at the same time, thereby forming the opening portion 33A. Accordingly, the shape of the opening portion 32 that has a level difference between the inner diameter of the insulation layer 15 and the inner diameter of the resist 34 and the protective layer 13 in FIG. 17G is transferred to the opening portion 33A of the insulation layer 15 and the inter-layer insulation layer 18. Further, when the etching is continued, the opening portion 33 that is opened to the second electrode pad 23 is formed as illustrated in FIG. 18I.

Figure 18J:
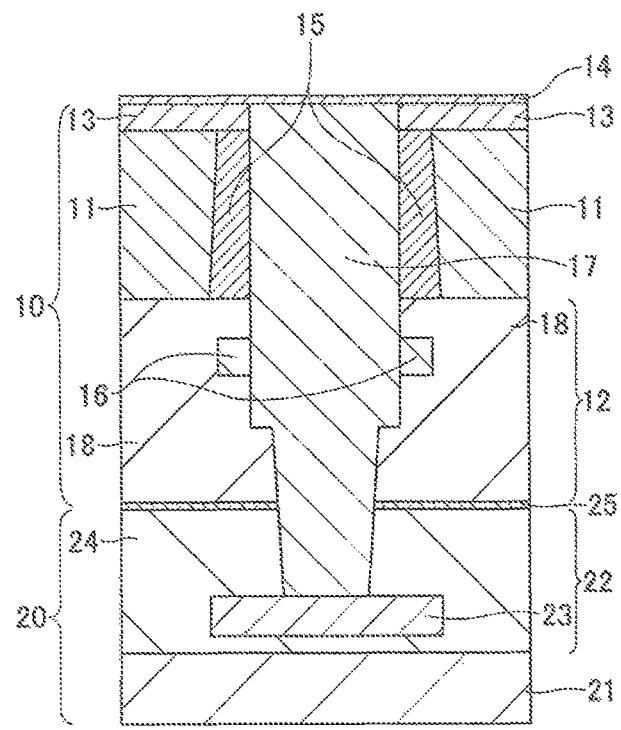

Next, after the through electrode 17 is formed in the opening portion, the protective layer 14 is formed as illustrated in FIG. 18J. This step can be performed using the same method as that of the step of the manufacturing method of the semiconductor device of the first embodiment described above illustrated in FIGS. 7G and 7H.

In the above step, by performing lithography once to pattern the resist 34, the opening portion 33 that is open to the second electrode pad 23 can be formed with fine controllability. In other words, by forming the opening of the resist 34 to be greater than the inner diameter of the insulation layer 15, the entire surface of the first semiconductor base substrate 11 within the insulation layer 15 can be exposed from the opening of the resist 34. For this reason, it is possible to suppress residues of the first semiconductor base substrate 11 within the insulation layer 15. Thus, it is possible to prevent the through electrode 17 from becoming a silicide within the insulation layer 15, and accordingly, reliability of the through electrode 17 improves.

In addition, by etching the insulation layer 15 that is exposed from the opening portion of the resist 34 and the inter-layer insulation layer 18 at the same time, an opening with a diameter substantially the same as that of the resist 34 and the opening portion of the first semiconductor base substrate 11 is formed at the position of the first electrode pad 16. For this reason, the inner diameter of the opening portion of the first electrode pad 16 can be increased, the contact area of the first electrode pad 16 and the through electrode 17 accordingly increases, and thereby connection reliability of the first electrode pad 16 and the through electrode 17 improves.

Further, the shape of the opening portion 32 that has a level difference between the inner diameter of the insulation layer 15 and the inner diameter of the resist 34 and the protective layer 13 is imprinted on the shape of the opening portion 33 that is directly above the second electrode pad 23. For this reason, the area of the bottom of the through electrode 17 can be reduced in comparison to the sectional area of the through electrode 17 in the first semiconductor base substrate 11 or the sectional area of the through electrode 17 at the position of the first electrode pad 16. Therefore, even when the area of the second electrode pad 23 is set to be small due to miniaturization of the device, connection of the through electrode 17 to the second electrode pad 23 becomes easy.

<8. Semiconductor Device According to the Fourth Embodiment>

A semiconductor device including a through electrode according to the fourth embodiment will be described.

Figure 19:
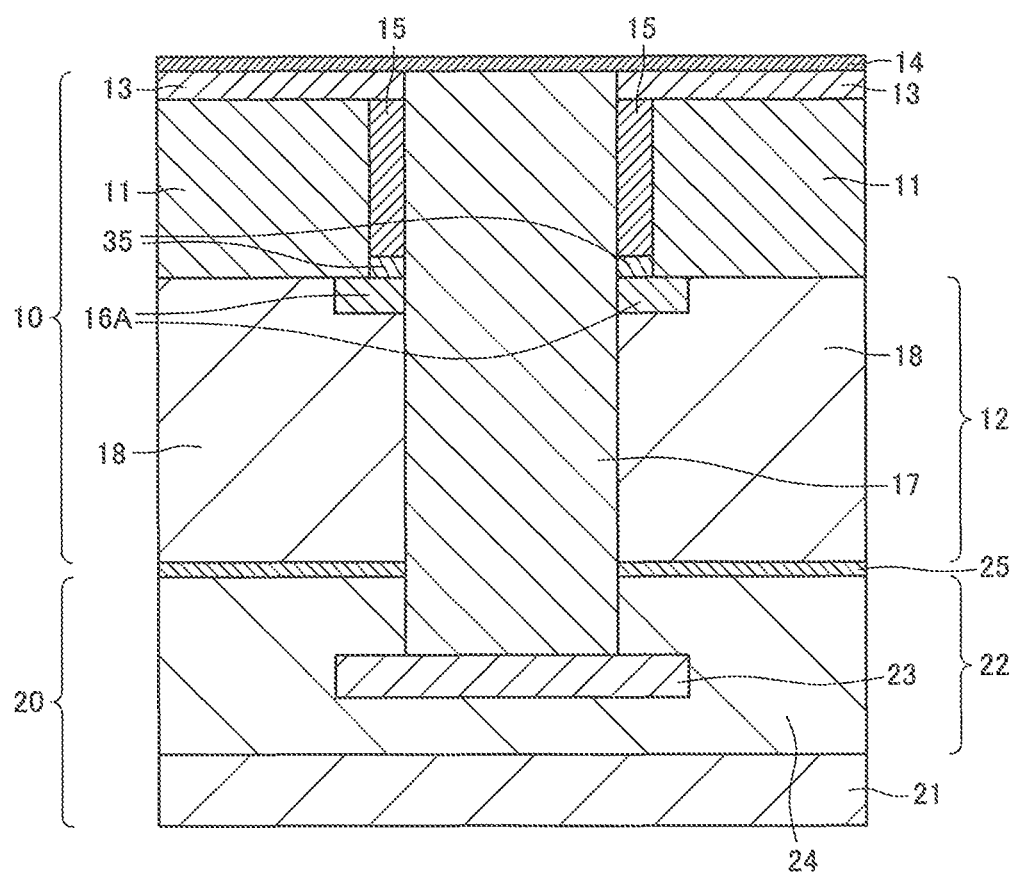
FIG. 19 is a sectional view illustrating a configuration of a semiconductor device according to a fourth embodiment.

FIG. 19 illustrates a schematic configuration of the semiconductor device including the through electrode according to the present embodiment. FIG. 19 is a sectional view illustrating the semiconductor device near a region in which the through electrode is formed. In FIG. 19, only the schematic configuration near the region in which the through electrode is formed is illustrated, and each configuration of a semiconductor base substrate or each configuration in the periphery of the through electrode is not illustrated. The same reference numerals are given to the constituent elements of the present embodiment having the same configurations as those of the semiconductor device of the first embodiment described above, and the detailed description will be omitted.

As illustrated in FIG. 19, the semiconductor device is configured by bonding the first chip 10 to the second chip 20. In addition, the through electrode 17 that penetrates from the second surface of the first semiconductor base substrate 11 to the second electrode pad 23 is included. The through electrode 17 is formed in the opening portion that penetrates the protective layer 13, the first semiconductor base substrate 11, and the wiring layers 12 and 22.

Note that the first chip 10 has the same configuration as that of the first embodiment described above except for the configurations of a first electrode pad 16A and an electrode protective layer 35, and the second chip 20 has the same configuration as that of the first embodiment described above.

In the semiconductor device illustrated in FIG. 19, the first electrode pad 16A is formed of tungsten (W), polysilicon, or the like. In addition, the electrode protective layer 35 is provided between the insulation layer 15 and the first electrode pad 16A.

Specifically, the electrode protective layer 35 is a layer that protects the first electrode pad 16A formed of, for example, tungsten (W), polysilicon, or the like from etching in an etching step during manufacturing. In addition, the electrode protective layer 35 is, for example, an oxide film formed of $SiO_2$.

Here, when the first electrode pad 16 is formed of Cu, discharge of Cu (contamination) from the exposed first electrode pad 16 occurs due to etching in the etching step performed at the time of formation of the opening portion 33, and accordingly, a processing speed of etching is lowered.

In addition, in order to reduce lowering of the processing speed described above, for example, a method of performing lithography and etching in two divided steps and thereby shortening the exposure time of the first electrode pad 16 that is formed of Cu is considered. Specifically, dividing the step of forming the opening portion 33 into a step of performing lithography and etching so as not to expose the first electrode pad 16 and a step of performing lithography and etching so as to expose the first electrode pad 16 is considered. When the method is used, however, the number of steps increases and thereby productivity deteriorates.

In the present embodiment, by using the first electrode pad 16A that is formed of a conductor, for example, tungsten, polysilicon, or the like, Cu contamination does not occur in the etching step. Thus, according to the present embodiment, lowering of the processing speed of etching caused by Cu contamination can be prevented. In addition, in the present embodiment, by providing the electrode protective layer 35 between the insulation layer 15 and the first electrode pad 16A, etching of the first electrode pad 16A in conjunction with the wiring layer 12 during etching performed at the time of formation of the opening portion 33 can be prevented.

In addition, the electrode protective layer 35 may be provided between the insulation layer 15 and the first electrode pad 16A, or the electrode protective layer 35 may not come in contact with the insulation layer 15 and the first electrode pad 16A. For example, another layer may be provided between the electrode protective layer 35 and the insulation layer 15, and another layer may be provided between the electrode protective layer 35 and the first electrode pad 16A.

Note that the shape of the first electrode pad 16A may be, for example, the same shape as the opening of the through electrode 17 in the first embodiment described above. In addition, the shape of the first electrode pad 16A is not limited to the above shape as long as it enables connection to the through electrode 17. For example, it may be a wiring shape extending only in one direction from the connection portion with the side surface of the through electrode 17.

In addition, the electrode protective layer 35 may have the shape corresponding to the first electrode pad 16A, or may be any shape as long as the shape enables protection of the first electrode pad 16A.

The first electrode pad 16A is formed of, for example, a conductor such as tungsten or polysilicon. In addition, the first electrode pad 16A can also be formed of a metal gate material. Specifically, the first electrode pad 16A may be formed of a titanium (Ti)-based or a tantalum (Ta)-based conductor or the like, and more specifically, may be formed of TiN or TaN.

The electrode protective layer 35 is formed of, for example $SiO_2$. In addition, the electrode protective layer 35 can also be formed of a high-k material that is used for a gate oxide film. Specifically, the electrode protective layer 35 may be formed of a hafnium (HO-based material or the like, and more specifically, may be formed of $HfO_2$, $HfSiO_2$, or HfSiON.

Note that, as will be described in <9. Method of manufacturing a semiconductor device according to the fourth embodiment> below, the electrode protective layer 35 and the first electrode pad 16A are preferably formed along with another oxide film and wiring in the step of forming the wiring layer 12. With this configuration, the electrode protective layer 35 and the first electrode pad 16A can be formed without increasing the number of steps in the present embodiment. For this reason, the electrode protective layer 35 is preferably formed of the same material as an oxide included in the wiring layer 12, and the first electrode pad 16A is preferably formed of the same material as that of a wire or electrode included in the wiring layer 12.

Figure 20:
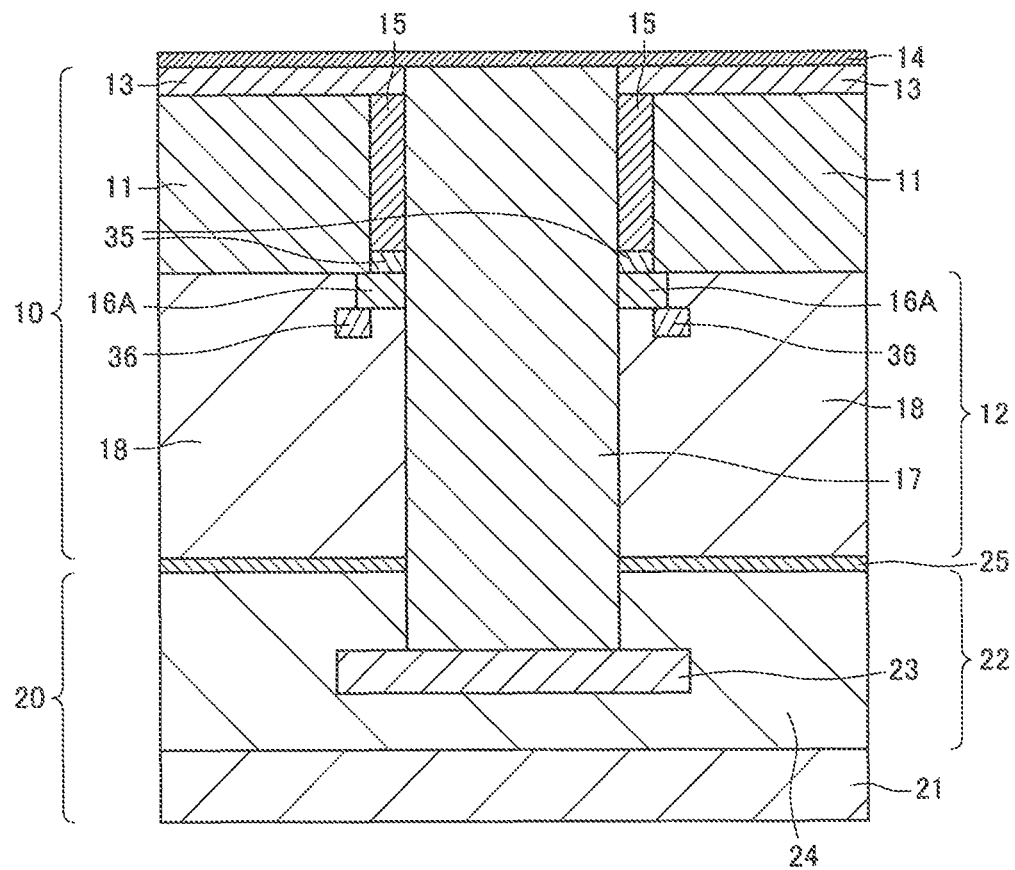
FIG. 20 is a sectional view illustrating a configuration of a modified example of the semiconductor device according to the fourth embodiment.
Figure 21:
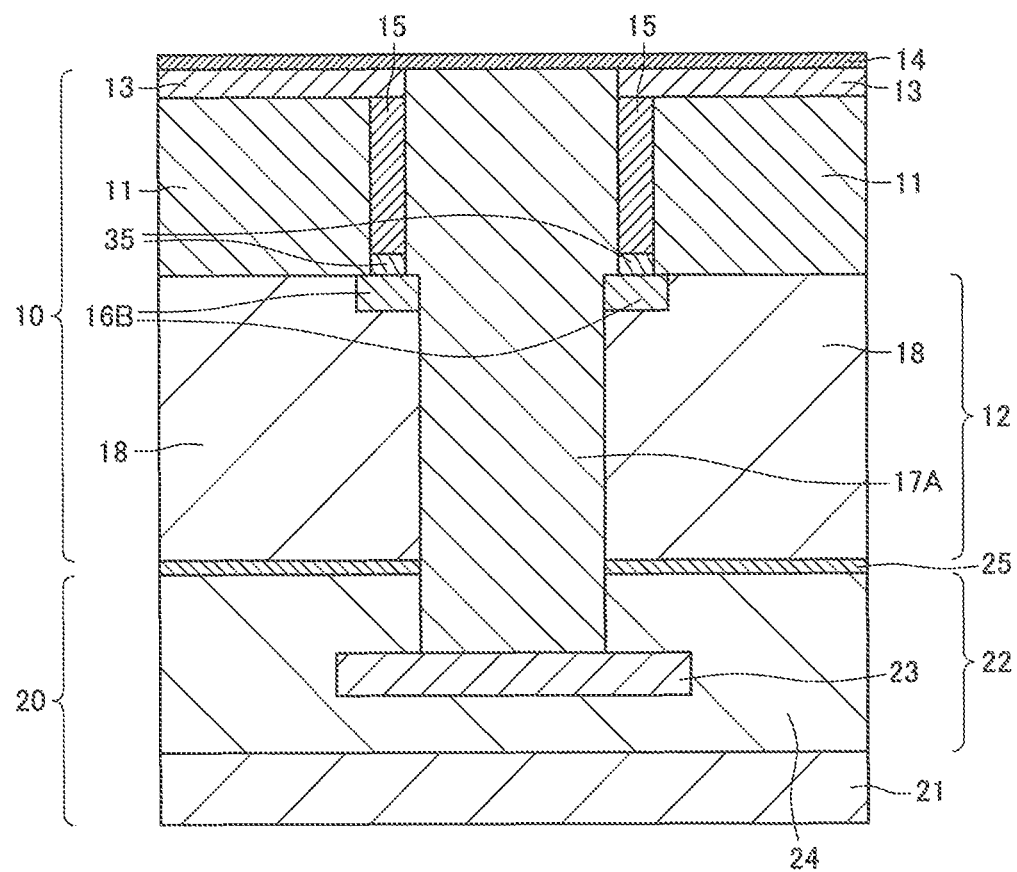
FIG. 21 is a sectional view illustrating a configuration of another modified example of the semiconductor device according to the fourth embodiment.

Furthermore, the present embodiment is not limited to the above example. The present embodiment may employ, for example, the configuration of the semiconductor device as illustrated in FIGS. 20 and 21. FIGS. 20 and 21 are sectional views of the semiconductor device near a region in which a through electrode according to a modified example of the present embodiment is formed.

In the semiconductor device illustrated in FIG. 20, a wiring electrode 36 that electrically connects the first electrode pad 16A to the wiring of the wiring layer 12 is further provided. Note that configurations other than the wiring electrode 36 are the same as those described with reference to FIG. 19.

In the modified example illustrated in FIG. 20, the wiring electrode 36 is formed of, for example, Cu. For this reason, the first electrode pad 16A can be electrically connected to the wiring (not illustrated) of the wiring layer 12 via the wiring electrode 36 that is formed of Cu having a smaller electric resistance. Thus, in the modified example illustrated in FIG. 20, connection reliability between the through electrode 17 and the wiring layer 12 can be further improved.

Note that, in the modified example illustrated in FIG. 20, the wiring electrode 36 that is formed of Cu is formed outward in the center direction of the opening from the edge portion at the opening side of the first electrode pad 16A, and thus it is needless to say that the wiring electrode is not exposed in the opening portion 33 during the step of forming the opening portion 33.

In addition, in the semiconductor device illustrated in FIG. 21, the opening width of a first electrode pad 16B that is formed of tungsten, polysilicon, or the like is formed to be smaller than the opening width of the insulation layer 15, and a through electrode 17A is provided in the opening portion. Note that configurations other than the first electrode pad 16B and the through electrode 17A are the same as those described with reference to FIG. 19.

In the modified example illustrated in FIG. 21, first in the step of forming the opening portion 33, the first semiconductor base substrate 11 is etched up to the above of the electrode protective layer 35 that protects the first electrode pad 16B. Next, when etching is performed from the electrode protective layer 35 to the wiring layer 22 above the second semiconductor base substrate 21, etching of the electrode protective layer 35 and the wiring layers 12 and 22 is performed using the first electrode pad 16B as a mask by appropriately setting a condition for the etching.

With this configuration, the contact area with the through electrode 17A can be increased, and thereby the first electrode pad 16B can be electrically connected to the through electrode 17A reliably. Thus, in the modified example illustrated in FIG. 21, connection reliability between the through electrode 17A and the first electrode pad 16B can be improved.

<9. Method of Manufacturing the Semiconductor Device According to the Fourth Embodiment>

Next, an example of a method of manufacturing the semiconductor device according to the fourth embodiment will be described. Note that, in the following description of the manufacturing method, only the method of manufacturing the configuration of the through electrode and the periphery of the through electrode of the semiconductor device illustrated in FIG. 19 described above will be described, and the description of the method of manufacturing the configuration of the other elements or wirings or the like will be omitted. The semiconductor base substrates, the wiring layer, the other various kinds of transistors, various elements, and the like can be manufactured according to methods of the related art. In addition, detailed description of the configuration of the semiconductor device of the first embodiment described above, the configuration and the operation described in the manufacturing method, and the like will be omitted.

First, using the same method as that of the first embodiment described above, steps up to the step of forming the insulation layer 15 in the first semiconductor base substrate 11 illustrated in FIG. 4A are performed.

Figure 22A:
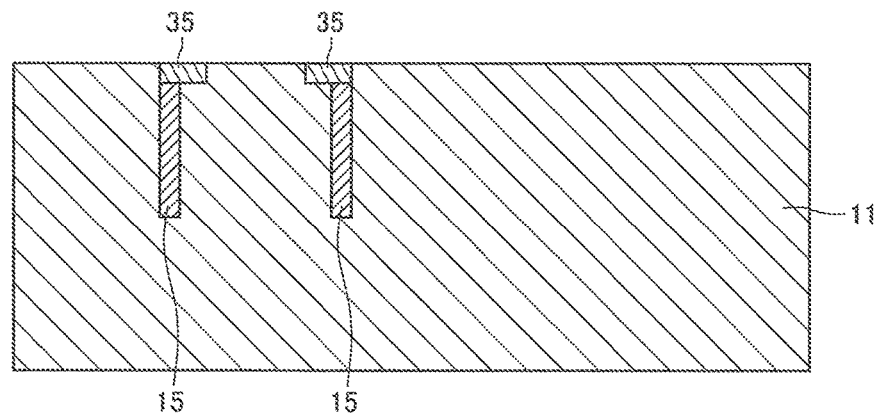
FIGS. 22A and 22B are diagrams illustrating processes of manufacturing the semiconductor device according to the fourth embodiment.

Next, as illustrated in FIG. 22A, the electrode protective layer 35 is formed on the insulation layer 15 on the first surface side of the first semiconductor base substrate 11. The electrode protective layer 35 is preferably formed such that the edge portion of the electrode protective layer 35 on its opening side protrudes more in the center direction of the opening than the edge portion of the insulation layer 15 on its opening side. Specifically, the electrode protective layer 35 is formed in, for example, a ring shape. Here, the inner diameter of the electrode protective layer 35 is preferably smaller than the inner diameter of the opening portion of the insulation layer 15 on the electrode protective layer 35 side.

According to the above configuration, the electrode protective layer 35 according to the present embodiment can protect the first electrode pad 16A from etching more reliably when etching is performed in the step of forming the opening portion 33 to be described later.

The electrode protective layer 35 may be formed in, for example, an element separation step in which a transistor or the like formed on the first surface of the first semiconductor base substrate 11 is separated. As such an element separation method, any of various techniques, for example, a shallow trench isolation (STI) technique, a local oxidation of silicon (LOCOS) technique, an expanding photodiode design for isolation (EDI) technique, or the like can be used. In addition, the electrode protective layer 35 may be formed in the step of forming the inter-layer insulation layer 18 in the wiring layer 12, and further, the electrode protective layer 35 may be formed in the step of forming a gate oxide film.

Figure 22B:
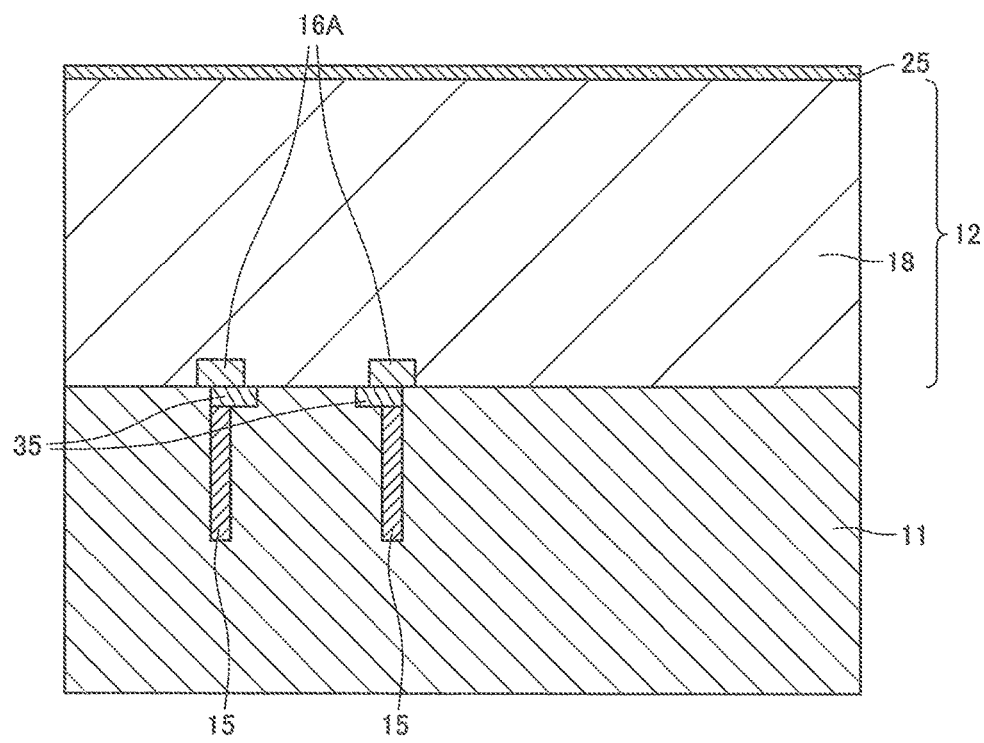

In succession, the wiring layer 12 is formed on the first surface side of the first semiconductor base substrate 11 and the bonding surface 25 is further formed on the flattened wiring layer 12 as illustrated in FIG. 22B. The wiring layer 12 is a multi-layered wiring layer composed of a plurality of conductive layers and inter-layer insulation layers, including the first electrode pad 16A. The first electrode pad 16A is formed on, for example, the electrode protective layer 35. In addition, the width of the opening portion of the formed first electrode pad 16A is preferably smaller than the width of the opening portion of the insulation layer 15 for connection to the through electrode 17.

The first electrode pad 16A may be formed in the step of forming wiring in the wiring layer 12, and may be formed in the step of forming a gate electrode that is formed of a metal gate material.

Figure 23C:
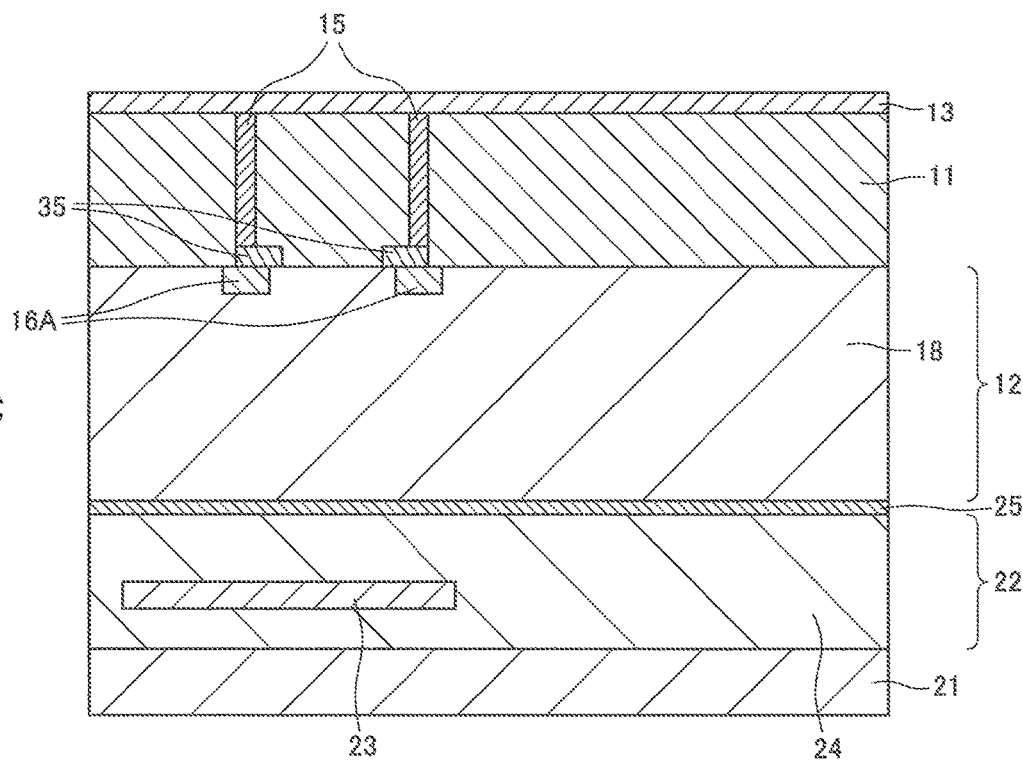
FIG. 23C is a diagram illustrating processes of manufacturing the semiconductor device according to the fourth embodiment.

In addition, the first semiconductor base substrate 11 and the second semiconductor base substrate 12 are bonded to each other as illustrated in FIG. 23C, and the first semiconductor base substrate 11 is further polished to be thinned. This step can be performed using the same method as the manufacturing method of the semiconductor device of the first embodiment described above in FIGS. 5C and 5D.

Figure 24D:
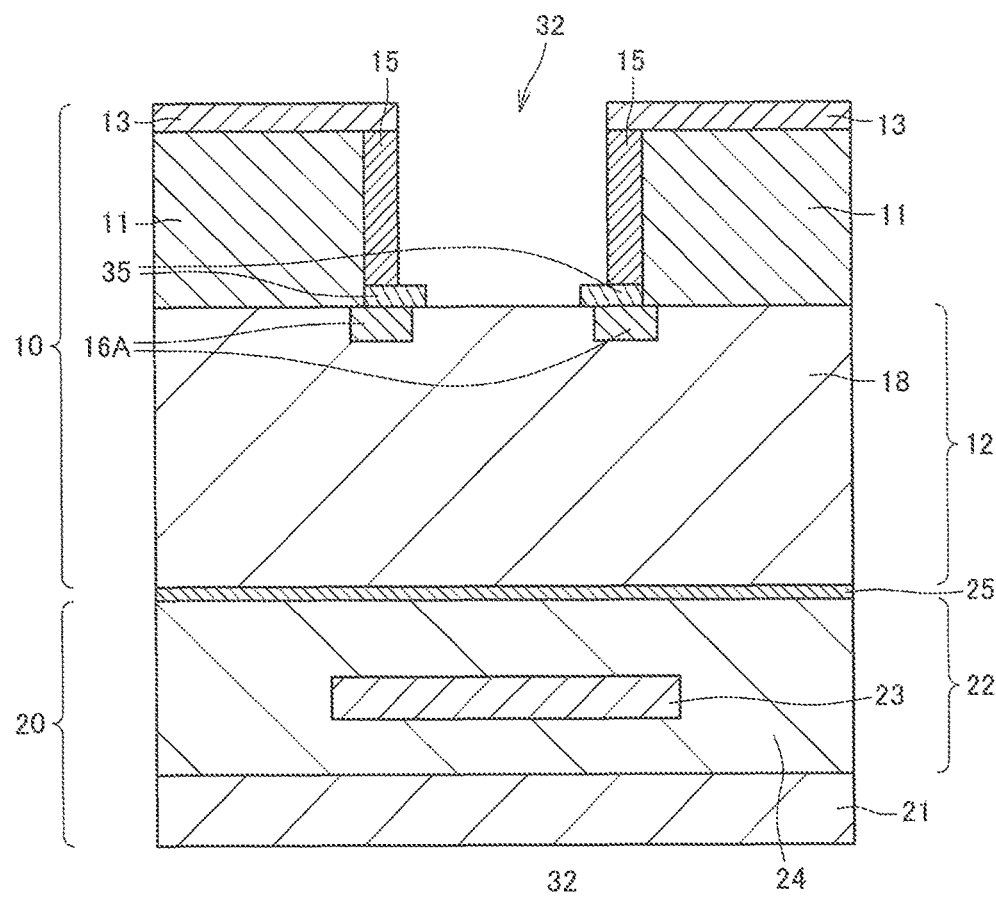
FIGS. 24D and 24E are diagrams illustrating processes of manufacturing the semiconductor device according to the fourth embodiment.

Next, the portion surrounded by the insulation layer 15 of the first semiconductor base substrate 11 is removed through dry etching or the like, and thereby the inside of the insulation layer 15 is exposed as illustrated in FIG. 24D. Through this step, the opening portion 32 is formed in the portion surrounded by the insulation layer 15 of the first semiconductor base substrate 11. Here, the electrode protective layer 35 that is formed of $SiO_2$ is not removed in the step of forming the opening portion 32 described above due to a high selectivity to the first semiconductor base substrate 11, and thus can protect the first electrode pad 16A that is positioned in the lower layer of the electrode protective layer 35.

Figure 24E:
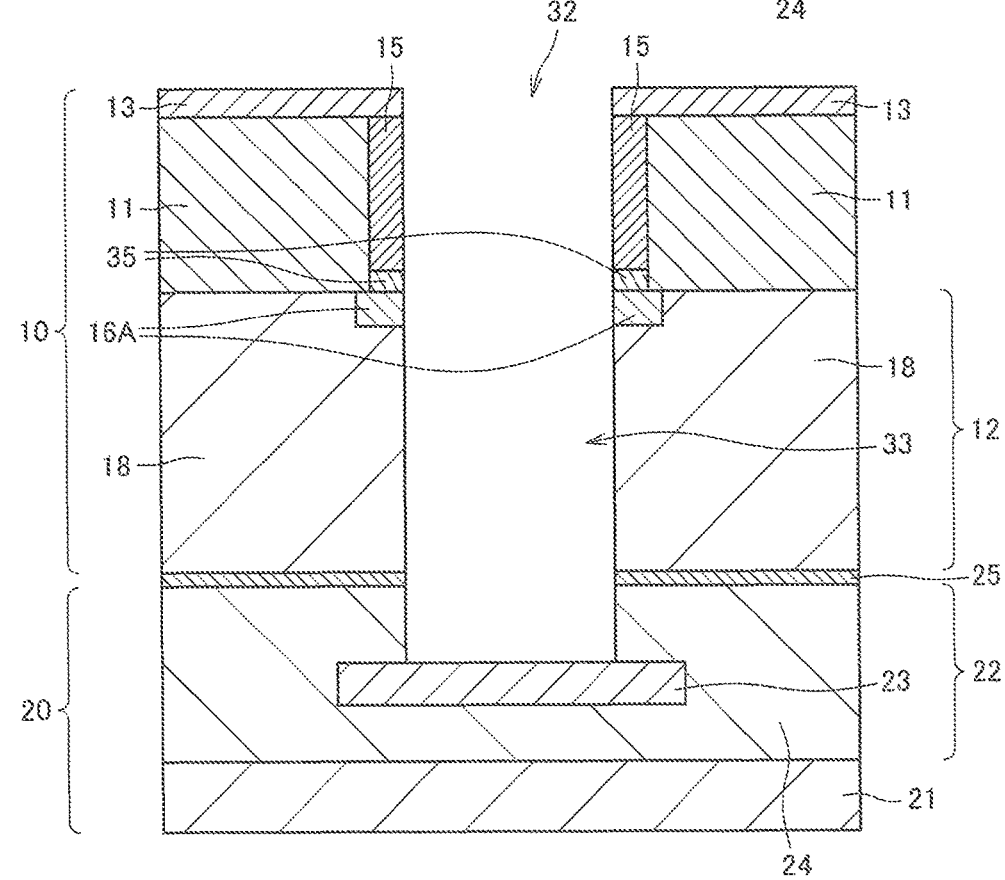

In succession, the portion from the wiring layer 12 of the first chip 10 in the lower part of the opening portion 32 to the second electrode pad 23 provided in the wiring layer 22 of the second chip 20 is opened through dry etching or the like, and thereby the opening portion 33 is formed as illustrated in FIG. 24E.

Note that, in FIG. 24E, the first electrode pad 16A that protrudes more in the center direction of the opening than the edge portion of the insulation layer 15 on its opening side is also removed in the step of forming the opening portion 33, however, the present embodiment is not limited to this example. As described above with reference to FIG. 21, by appropriately controlling the condition for dry etching, the first electrode pad 16A is not removed but used as a mask, and then the electrode protective layer 35, the wiring layers 12 and 22, and the like can be removed.

Figure 25F:
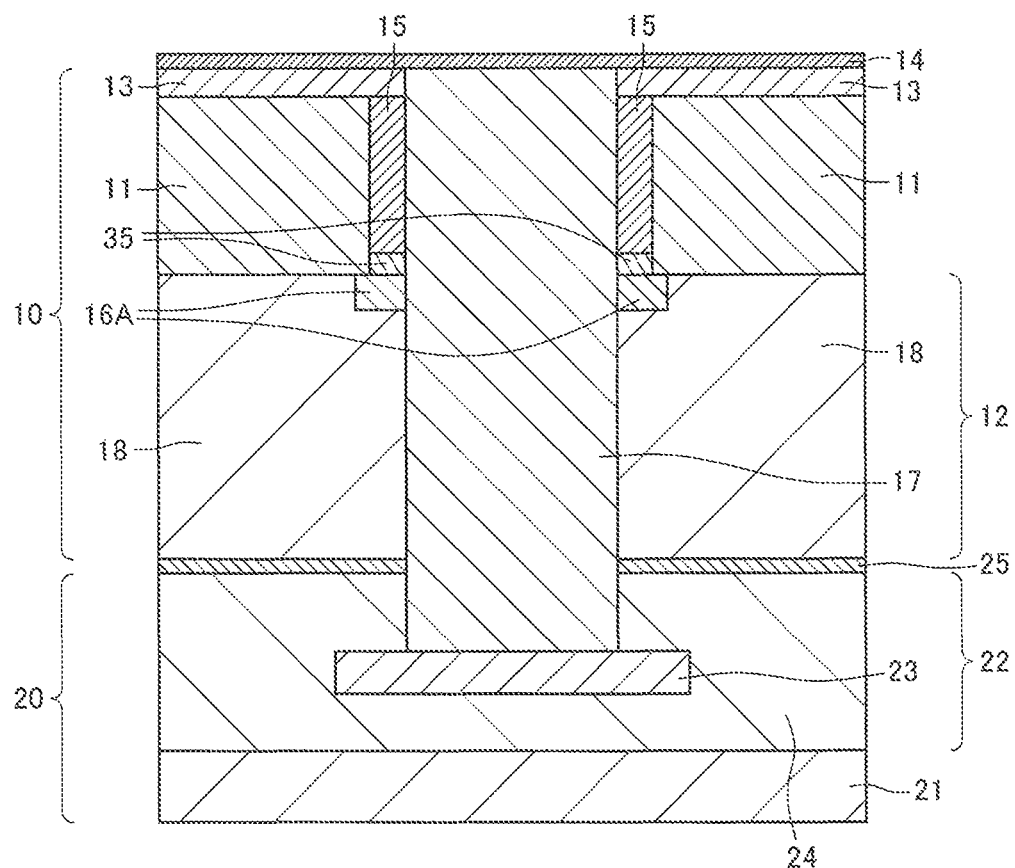
FIG. 25F is a diagram illustrating processes of manufacturing the semiconductor device according to the fourth embodiment.
Figure 26:
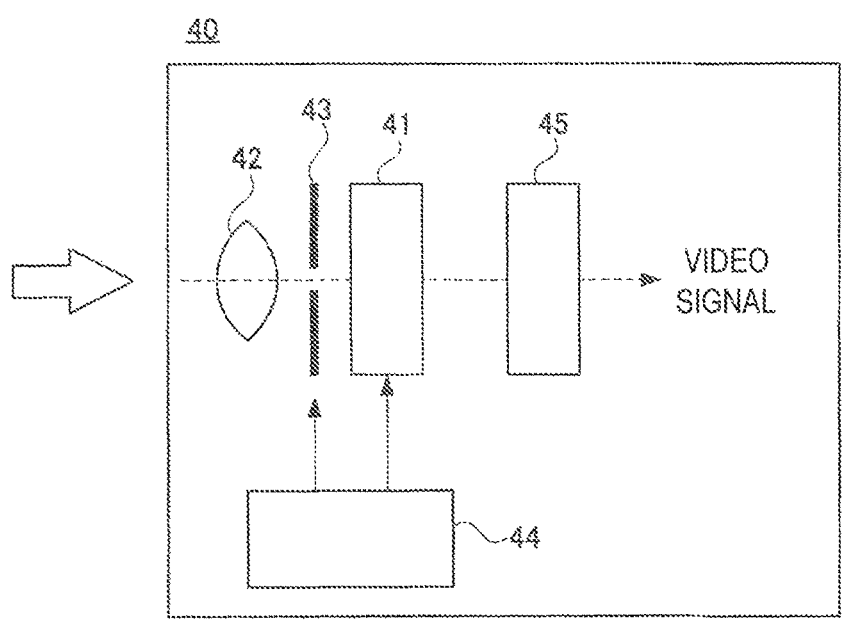
FIG. 26 is a diagram illustrating a configuration of an electronic device.

Further, after a conductive layer serving as the through electrode 17 is formed in the opening portions 32 and 33 as illustrated in FIG. 25F, the protective layer 14 is formed. This step can be performed using the same method as the manufacturing method of the semiconductor device of the first embodiment described above in FIGS. 7G and 7H.

As described above, the manufacturing method described above includes the step of forming the electrode protective layer 35 between the insulation layer 15 and the first electrode pad 16A. Due to this step, the electrode protective layer 35 can protect the first electrode pad 16A from etching in the step of etching the first semiconductor base substrate 11. In addition, in the manufacturing method described above, the electrode protective layer 35 is formed so that the edge portion of the electrode protective layer 35 on its opening side protrudes more in the center direction of the opening than the edge portion of the insulation layer 15 on its opening side. With this configuration, the first electrode pad 16A can be protected from etching in the manufacturing method described above.

According to the semiconductor device of the present embodiment described above, by providing the electrode protective layer 35 between the insulation layer 15 and the first electrode pad 16A, the first electrode pad 16A can be protected from etching in the step of forming the opening portion 33. For this reason, tungsten, polysilicon, or the like that is a conductor having a low processing selectivity to the first semiconductor base substrate 11 can be used as the first electrode pad 16A. Thus, the semiconductor device of the present embodiment can resolve reduction in an etching processing speed caused by Cu contamination and reduction in productivity caused by an increase in the number of steps, and thereby productivity can be enhanced.

<10. Electronic Device>

[Solid-State Imaging Device]

Hereinafter, an example in which the configuration of an electrode junction according to the above-described embodiment is applied to a solid-state imaging device will be described. The solid-state imaging device is applicable to an electronic device, for example, a camera system such as a digital camera or a video camera, a mobile telephone having an imaging function, other devices having an imaging function, and the like. Hereinafter, a camera will be described as one configuration example of the electronic device.

FIG. 19 illustrates an example of the configuration of a video camera capable of capturing a still image or a moving image.

A camera 40 of this example includes a solid-state imaging device 41, an optical system 42 that guides incident light to a light-reception sensor unit of the solid-state imaging device 41, a shutter device 43 installed between the solid-state imaging device 41 and the optical system 42, and a driving circuit 44 that drives the solid-state imaging device 41. The camera 40 further includes a signal processing circuit 45 that processes an output signal of the solid-state imaging device 41.

The solid-state imaging device 41 includes the through electrode according to the above-described embodiment of the present disclosure described above. The configurations and functions of the other units are as follows.

The optical system (optical lens) 42 forms an image of image light (incident light) from a subject on an imaging surface (not illustrated) of the solid-state imaging device 41. Thus, signal charges are accumulated in the solid-state imaging device 41 for a given period. Note that, the optical system 42 may include an optical lens group including a plurality of optical lenses. In addition, the shutter device 43 controls a light irradiation period and a light blocking period of the incident light on the solid-state imaging device 41.

The driving circuit 44 supplies a driving signal to the solid-state imaging device 41 and the shutter device 43. In addition, the driving circuit 44 controls an operation of outputting a signal to the signal processing circuit 45 of the solid-state imaging device 41 and a shutter operation of the shutter device 43 based on the supplied driving signal. That is, in this example, an operation of transmitting a signal from the solid-state imaging device 41 to the signal processing circuit 45 is performed based on the driving signal (timing signal) supplied from the driving circuit 44.

The signal processing circuit 45 performs various kinds of signal processing on the signal transmitted from the solid-state imaging device 41. A signal (video signal) subjected to the various kinds of signal processing is stored in a storage medium (not illustrated) such as a memory or is output to a monitor (not illustrated).

The preferred embodiments of the present disclosure have been described above with reference to the accompanying drawings, whilst the technical scope of the present disclosure is not limited to the above examples. A person skilled in the art may find various alterations and modifications within the scope of the appended claims, and it should be understood that they will naturally come under the technical scope of the present invention.

Additionally, the present technology may also be configured as below.

(1)

A semiconductor device including:

a first semiconductor base substrate;

a second semiconductor base substrate that is bonded onto a first surface side of the first semiconductor base substrate;

a through electrode that is formed to penetrate from a second surface side of the first semiconductor base substrate to a wiring layer on the second semiconductor base substrate; and an insulation layer that surrounds a circumference of the through electrode formed inside the first semiconductor base substrate.

(2)

The semiconductor device according to (1), including:

a first conductive layer in a wiring layer on the first surface of the first semiconductor base substrate, wherein a side surface of the through electrode is connected to the first conductive layer.

(3)

The semiconductor device according to (2), wherein a bottom portion of the through electrode is connected to a second conductive layer provided in the wiring layer on the second semiconductor base substrate, and the first and second conductive layers are connected to each other via the through electrode.

(4)

The semiconductor device according to (2) or (3), wherein the first conductive layer includes an opening connected to the side surface of the through electrode.

(5)

The semiconductor device according to (4), wherein an opening width of the first conductive layer is smaller than a width of an opening portion of the through electrode.

(6)

The semiconductor device according to any one of (1) to (5), wherein a length of an inside of the insulation layer is greater than a width of an opening portion of the through electrode.

(7)

The semiconductor device according to (4) or (5), wherein the opening of the first conductive layer is formed such that an opening on the second surface side of the first semiconductor base substrate is great and an opening on the first surface side of the first semiconductor base substrate is small.

(8)

The semiconductor device according to (7), wherein the opening of the first conductive layer is formed in a shape having an inclined surface.

(9)

The semiconductor device according to (8), wherein an inclination angle of an inner surface of an opening portion of the first conductive layer is equal to or smaller than 40°.

(10)

The semiconductor device according to any one of (2) to (9), including:

an electrode protective layer disposed between the insulation layer, the first conductive layer protecting the first conductive layer.

(11)

The semiconductor device according to (10), wherein the electrode protective layer is formed of a same material as an oxide included in the wiring layer on the first surface of the first semiconductor base substrate, and wherein the first conductive layer is formed of a same material as one of a wire or an electrode included in the wiring layer on the first surface of the first semiconductor base substrate.

(12)

A method of manufacturing a semiconductor device including a through electrode that penetrates a first semiconductor base substrate, the method including:

a step of forming an insulation layer that surrounds a circumference of a position at which the through electrode is formed, on a first surface of the first semiconductor base substrate;

a step of bonding a second semiconductor base substrate to a first surface side of the first semiconductor base substrate;

a step of forming an opening portion that penetrates from a second surface side of the first semiconductor base substrate to a wiring layer on the second semiconductor base substrate within a range surrounded by the insulation layer; and a step of forming the through electrode inside the opening portion.

(13)

The method of manufacturing a semiconductor device according to (12), further including:

a step of etching the first semiconductor base substrate within the range surrounded by the insulation layer, and then etching the first semiconductor base substrate remaining in an inner wall surface of the insulation layer in the step of forming the opening portion.

(14)

The method of manufacturing a semiconductor device according to (12) or (13), including:

a step of forming a first conductive layer in a wiring layer on the first surface of the first semiconductor base substrate, wherein, in the step of forming the opening portion, an opening portion is formed in the first conductive layer such that an opening on the second surface side of the first semiconductor base substrate is large and an opening on the first surface side of the first semiconductor base substrate is small.

(15)

The method of manufacturing a semiconductor device according to any one of (12) to (14), including:

a step of selectively etching the first semiconductor base substrate in the range surrounded by the insulation layer; and a step of etching a part of an inner surface side of the insulation layer.

(16)

The method of manufacturing a semiconductor device according to (12), including:

a step of forming a first conductive layer in a wiring layer on the first surface of the first semiconductor base substrate, and forming an electrode protective layer between the insulation layer and the first conductive layer, wherein the step of forming the opening portion includes a step of etching the first semiconductor base substrate in the range surrounded by the insulation layer and a step of etching the portion from the electrode protective layer to the wiring layer on the second semiconductor base substrate.

(17)

The method of manufacturing a semiconductor device according to (16), wherein, in the step of forming the electrode protective layer, the electrode protective layer is formed such that the edge portion on an opening side of the electrode protective layer protrudes more in the center direction of an opening than the edge portion on an opening side of the insulation layer.

(18)

The method of manufacturing a semiconductor device according to (16) or (17), wherein the electrode protective layer and the first conductive layer are formed in conjunction with the wiring layer on the first surface of the first semiconductor base substrate.

(19)

An electronic device including:

a semiconductor device according to any one of (1) to (11); and a signal processing circuit that processes an output signal of the semiconductor device.

REFERENCE SIGNS LIST

10 first chip
11 first semiconductor base substrate
12, 22 wiring layer
13, 14 protective layer
15 insulation layer
16, 16A, 16B first electrode pad
17, 17A through electrode
18, 24 inter-layer insulation layer
20 second chip
21 second semiconductor base substrate
23 second electrode pad
25 bonding surface
31 hard mask layer
32, 33, 33A, 33B opening portion
34 resist
35 electrode protective layer
36 wiring electrode
40 camera
41 solid-state imaging device
42 optical system
43 shutter device
44 driving circuit
45 signal processing circuit

What is claimed:

1. A semiconductor device, comprising:
a first semiconductor base substrate;
a first wiring layer on a first side of the first semiconductor base substrate, wherein the first wiring layer includes a first inter-layer insulation layer and a first conductive layer formed in the first inter-layer insulation layer;
a second semiconductor base substrate;
a second wiring layer on a side of the second semiconductor base substrate facing the first side of the first semiconductor base substrate, wherein the second wiring layer includes a second inter-layer insulation layer and a second conductive layer formed in the second inter-layer insulation layer, and wherein the first wiring layer is bonded to the second wiring layer;

a through electrode that is formed to penetrate from a second surface side of the first semiconductor base substrate to the second wiring layer; and an insulation layer that surrounds a circumference of the through electrode formed inside the first semiconductor base substrate, wherein the insulation layer is formed of a first material, and wherein the first inter-layer insulation layer is formed of the first material.

2. The semiconductor device according to claim 1, wherein a first electrode pad is included in the first conductive layer, and wherein a side surface of the through electrode is connected to the first electrode pad in the first conductive layer.

3. The semiconductor device according to claim 2, wherein a second electrode pad is included in the second conductive layer, wherein a bottom portion of the through electrode is connected to the second electrode pad in the second conductive layer, and wherein the first and second conductive layers are connected to each other via the through electrode.

4. The semiconductor device according to claim 2, wherein the first electrode pad included in the first conductive layer includes an opening connected to the side surface of the through electrode.

5. The semiconductor device according to claim 4, wherein an opening diameter of the first electrode pad included in the first conductive layer and an opening diameter of the first semiconductor base substrate are substantially the same.

6. The semiconductor device according to claim 1, wherein a length of an inside of the insulation layer is greater than a width of an opening portion of the through electrode.

7. The semiconductor device according to claim 4, wherein the opening of the first conductive layer is greater than a diameter of the through electrode in contact with a second electrode pad included in the second conductive layer.

8. The semiconductor device according to claim 7, wherein the opening of the first conductive layer is formed in a shape having an inclined surface.

9. The semiconductor device according to claim 8, wherein an inclination angle of an inner surface of an opening portion of the first conductive layer is equal to or smaller than 40°.

10. The semiconductor device according to claim 2, comprising:
an electrode protective layer disposed between the insulation layer, the electrode protective layer protecting the first conductive layer.

11. The semiconductor device according to claim 10, wherein the electrode protective layer is formed of a same material as an oxide included in the wiring layer on the first surface of the first semiconductor base substrate, and wherein the first conductive layer is formed of a same material as one of a wire or an electrode included in the wiring layer on the first surface of the first semiconductor base substrate.

12. A method of manufacturing a semiconductor device including a through electrode that penetrates a first semiconductor base substrate, the method comprising:
forming an insulation layer that surrounds a circumference of a position at which the through electrode is formed, on a first surface of the first semiconductor base substrate;

forming a first wiring layer on a first side of the first semiconductor base substrate, wherein the first wiring layer includes a first inter-layer insulation layer and a first conductive layer formed in the first inter-layer insulation layer;

forming a second wiring layer on a side of a second semiconductor base substrate facing the first side of the first semiconductor base substrate, wherein the second wiring layer includes a second inter-layer insulation layer and a second conductive layer formed in the second inter-layer insulation layer;

bonding the first wiring layer to the second wiring layer;

forming an opening portion that penetrates from a second surface side of the first semiconductor base substrate to the second wiring layer on the second semiconductor base substrate within a range surrounded by the insulation layer, wherein the insulation layer is formed of a first material, and wherein the first inter-layer insulation layer is formed of the first material; and forming the through electrode inside the opening portion.

13. The method of manufacturing a semiconductor device according to claim 12, further comprising:
etching the first semiconductor base substrate within the range surrounded by the insulation layer, and then etching the first semiconductor base substrate remaining in an inner wall surface of the insulation layer in the step of forming the opening portion.

14. The method of manufacturing a semiconductor device according to claim 12,
wherein, in the step of forming the opening portion, an opening portion is formed in the first conductive layer having a diameter that substantially equal to a diameter of the opening portion at the second surface side of the first semiconductor base substrate.

15. The method of manufacturing a semiconductor device according to claim 12, comprising:
selectively etching the first semiconductor base substrate in the range surrounded by the insulation layer; and
etching a part of an inner surface side of the insulation layer.

16. An electronic device, comprising:
a semiconductor device that includes:
a first semiconductor base substrate;
a first wiring layer on a first side of the first semiconductor base substrate, wherein the first wiring layer includes a first inter-layer insulation layer and a first conductive layer formed in the first inter-layer insulation layer;
a second semiconductor base substrate;
a second wiring layer on a side of the second semiconductor base substrate facing the first side of the first semiconductor base substrate, wherein the second wiring layer includes a second inter-layer insulation layer and a second conductive layer formed in the second inter-layer insulation layer, and wherein the first wiring layer is bonded to the second wiring layer;
a through electrode that is formed to penetrate from a second surface side of the first semiconductor base substrate to the second wiring layer; and
an insulation layer that surrounds a circumference of the through electrode formed inside the first semiconductor base substrate, wherein the insulation layer is formed of a first material, and wherein the first inter-layer insulation layer is formed of the first material; and a signal processing circuit that processes an output signal of the semiconductor device.

17. The semiconductor device according to claim 5, wherein the opening of the first conductive layer is greater than a diameter of the through electrode in contact with a second electrode pad included in the second conductive layer.

18. The method of manufacturing a semiconductor device according to claim 12, wherein a diameter of the opening portion and an opening diameter of a first electrode pad included in the first conductive layer are substantially equal.

19. The method of manufacturing a semiconductor device according to claim 18, wherein the opening diameter of the first electrode pad is greater than a diameter of an area of the through electrode in contact with a second electrode pad included in the second conductive layer.

20. The method of manufacturing a semiconductor device according to claim 12, wherein an opening diameter of a first electrode pad included in the first conductive layer is greater than a diameter of an area of the through electrode in contact with a second electrode pad included in the second conductive layer.

* * * * *